United States Patent
Sun

(10) Patent No.: US 12,052,928 B2
(45) Date of Patent: Jul. 30, 2024

(54) MAGNETORESISTIVE DEVICES AND METHODS THEREFOR

(71) Applicant: Everspin Technologies, Inc., Chandler, AZ (US)

(72) Inventor: Jijun Sun, Chandler, AZ (US)

(73) Assignee: Everspin Technologies, Inc., Chandler, AZ (US)

( * ) Notice: Subject to any disclaimer, the term of this patent is extended or adjusted under 35 U.S.C. 154(b) by 348 days.

(21) Appl. No.: 17/397,067

(22) Filed: Aug. 9, 2021

(65) Prior Publication Data

US 2023/0047005 A1 Feb. 16, 2023

(51) Int. Cl.
| | |
|---|---|
| *H10N 50/10* | (2023.01) |
| *G11C 11/16* | (2006.01) |
| *H01F 10/32* | (2006.01) |
| *H10B 61/00* | (2023.01) |
| *H10N 50/80* | (2023.01) |
| *H10N 50/85* | (2023.01) |

(52) U.S. Cl.
CPC .......... *H10N 50/10* (2023.02); *G11C 11/161* (2013.01); *H01F 10/3254* (2013.01); *H01F 10/3272* (2013.01); *H10B 61/20* (2023.02); *H10N 50/80* (2023.02); *H10N 50/85* (2023.02)

(58) Field of Classification Search
None
See application file for complete search history.

(56) References Cited

U.S. PATENT DOCUMENTS

| | | | | |
|---|---|---|---|---|
| 10,692,926 | B2 * | 6/2020 | Sun | .......................... H10N 50/85 |
| 2009/0213503 | A1 * | 8/2009 | Sun | ...................... H01F 10/3272 |
| | | | | 360/324.2 |
| 2012/0018823 | A1 * | 1/2012 | Huai | ...................... H10N 50/85 |
| | | | | 257/E29.323 |
| 2012/0230095 | A1 * | 9/2012 | Ranjan | ................. H01F 41/303 |
| | | | | 365/158 |

(Continued)

FOREIGN PATENT DOCUMENTS

| | | |
|---|---|---|
| WO | 2020106552 A1 | 5/2020 |
| WO | 2021045801 A1 | 3/2021 |

OTHER PUBLICATIONS

Extended European Search Report issued on Jan. 9, 2023 in counterpart European Patent Application No. 22188801.9 (11 pages, in English).

(Continued)

*Primary Examiner* — Kevin M Bernatz
(74) *Attorney, Agent, or Firm* — Bookoff McAndrews, PLLC

(57) ABSTRACT

A magnetoresistive stack may include: a fixed region having a fixed magnetic state, a spacer region, a first dielectric layer and a second dielectric layer, where both the first dielectric layer and the second dielectric layer are between the fixed region and the spacer region, and a free region between the first dielectric layer and the second dielectric layer. The free region may be configured to have a first magnetic state and a second magnetic state. The free region may include an interface layer, a multilayer structure, an insertion layer (e.g., a metallized insertion layer), one or more ferromagnetic layers (e.g., metallized ferromagnetic layers), and/or a transition layer (e.g., a metallized transition layer).

16 Claims, 11 Drawing Sheets

(56) References Cited

U.S. PATENT DOCUMENTS

| | | | |
|---|---|---|---|
| 2013/0088915 A1* | 4/2013 | Ranjan | B82Y 25/00 |
| | | | 257/295 |
| 2015/0129997 A1* | 5/2015 | Tang | G11C 11/161 |
| | | | 257/427 |
| 2015/0340601 A1* | 11/2015 | Huai | H10N 50/80 |
| | | | 257/421 |
| 2016/0197119 A1* | 7/2016 | Tang | H10N 50/80 |
| | | | 257/427 |
| 2018/0197589 A1* | 7/2018 | Tang | H10B 61/00 |
| 2018/0261762 A1* | 9/2018 | Apalkov | H10N 50/01 |
| 2019/0013460 A1* | 1/2019 | Ikegawa | H01F 41/32 |
| 2019/0123098 A1 | 4/2019 | Sun et al. | |
| 2019/0131519 A1* | 5/2019 | Ikegawa | H10N 50/01 |
| 2019/0198566 A1* | 6/2019 | Wang | H10B 61/20 |
| 2019/0295615 A1 | 9/2019 | Fukuzawa et al. | |
| 2019/0305213 A1* | 10/2019 | Sun | H10N 50/80 |
| 2019/0355897 A1* | 11/2019 | Sun | H10N 50/85 |
| 2019/0386212 A1* | 12/2019 | Whig | H10N 50/80 |
| 2021/0065761 A1* | 3/2021 | Santos | H01F 10/329 |
| 2021/0234090 A1* | 7/2021 | Shimon | H10N 52/101 |
| 2021/0288245 A1* | 9/2021 | Whig | H01F 10/3286 |
| 2021/0359201 A1* | 11/2021 | Sun | H10N 50/01 |
| 2022/0376172 A1* | 11/2022 | Wang | G11C 11/16 |
| 2023/0263071 A1* | 8/2023 | Ikegawa | H10N 50/01 |
| | | | 257/421 |

OTHER PUBLICATIONS

European Examination Report issued on Dec. 22, 2023 in counterpart European Patent Application No. 22188801.9.

* cited by examiner

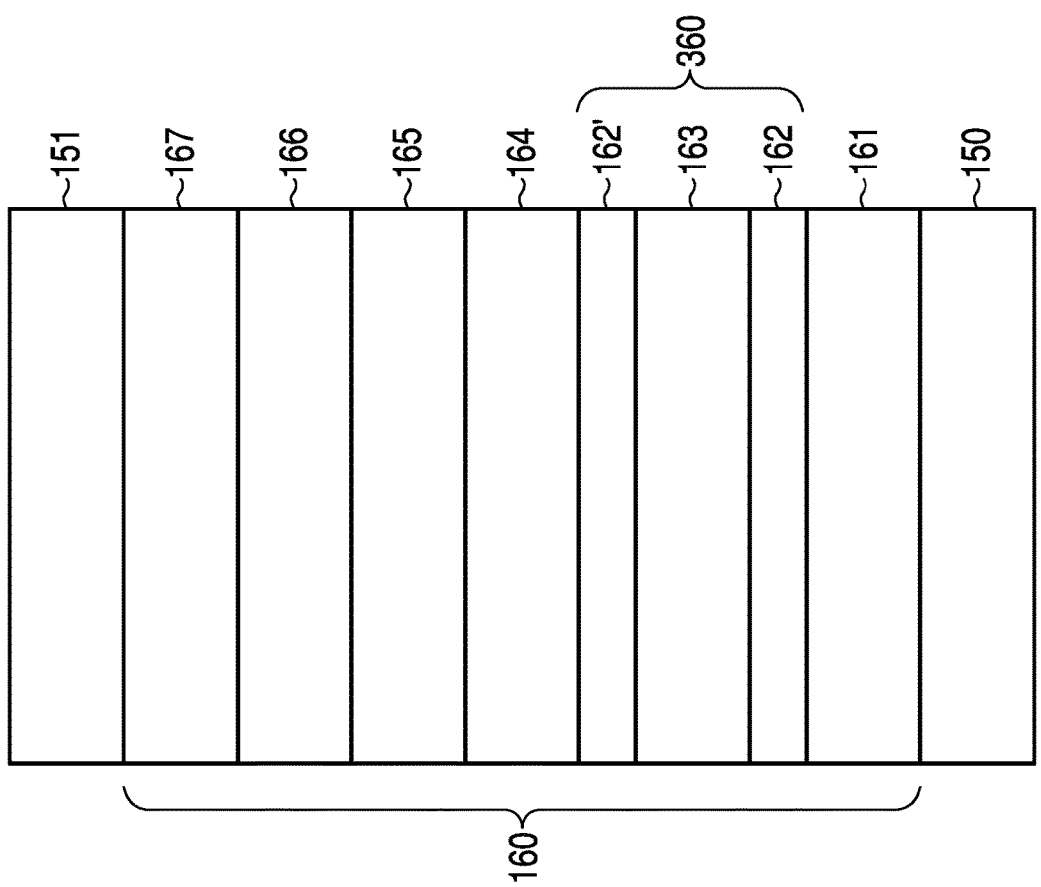
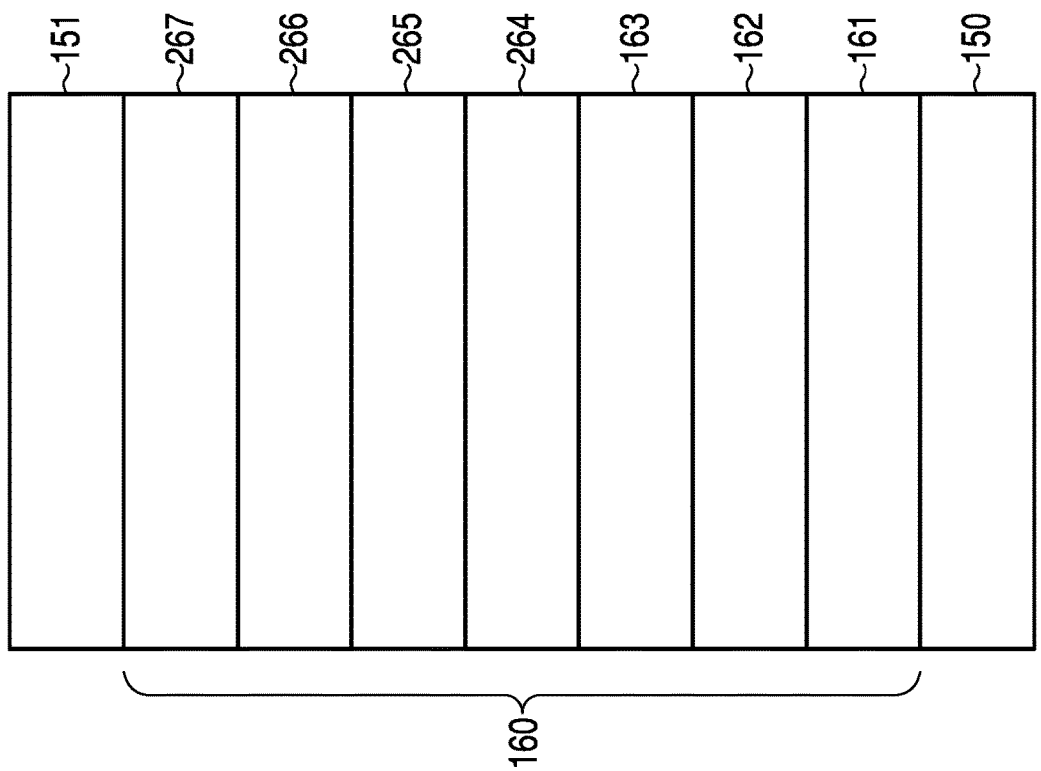

MAGNETORESISTIVE DEVICES AND METHODS THEREFOR

TECHNICAL FIELD

The present disclosure relates to magnetoresistive stacks and methods of manufacturing magnetoresistive stacks.

INTRODUCTION

There are many inventions described and illustrated herein, as well as many aspects and embodiments of those inventions. In one aspect, the present disclosure relates to magnetoresistive structures (for example, part of a magnetoresistive memory device, magnetoresistive sensor/transducer device, etc.) and methods of manufacturing the described magnetoresistive structures. For example, the disclosed structures may be related to magnetoresistive random access memory (MRAM) devices, magnetoresistive sensor/transducer devices, etc. To describe aspects of the disclosed devices and methods, exemplary magnetoresistive stack configurations are described. However, these are only exemplary. The disclosed devices can have many other stack configurations, and the disclosed methods can be applied to manufacture magnetoresistive devices having various suitable magnetoresistive stacks.

Briefly, a magnetoresistive stack used in a memory device (e.g., an MRAM device) includes at least one non-magnetic layer (for example, at least one dielectric layer or a non-magnetic yet electrically conductive layer) disposed between a fixed magnetic region and a free magnetic region, each including one or more layers of ferromagnetic materials. Information may be stored in the magnetoresistive stack by switching, programming, and/or controlling the direction of magnetization vectors in the magnetic layer(s) of the free magnetic region. The direction of the magnetization vectors of the free magnetic region may be switched and/or programmed (for example, through spin transfer torque (STT)) by application of a write signal (e.g., one or more current pulses) adjacent to, or through, the magnetoresistive memory stack. In contrast, the magnetization vectors in the magnetic layers of a fixed magnetic region are magnetically fixed in a predetermined direction. When the magnetization vectors of the free magnetic region adjacent to the non-magnetic layer are in the same direction as the magnetization vectors of the fixed magnetic region adjacent to the non-magnetic layer, the magnetoresistive memory stack has a first magnetic state. Conversely, when the magnetization vectors of the free magnetic region adjacent to the non-magnetic layer are opposite the direction of the magnetization vectors of the fixed magnetic region adjacent to the non-magnetic layer, the magnetoresistive memory stack has a second magnetic state. The magnetic regions on either side of the non-magnetic layer forms a magnetic tunnel junction (MTJ) when the non-magnetic layer is a dielectric material. The MTJ has different electrical resistances in the first and second magnetic states. For example, a resistance of the second magnetic state may be relatively higher than a resistance of the first magnetic state. The magnetic state of the magnetoresistive memory stack is determined or read based on the resistance of the stack in response to a read current applied, for example, through the magnetoresistive stack.

BRIEF DESCRIPTION OF THE DRAWINGS

Embodiments of the present disclosure may be implemented in connection with aspects illustrated in the attached drawings. These drawings show different aspects of the present disclosure and, where appropriate, reference numerals illustrating like structures, components, materials, and/or elements in different figures are labeled similarly. It is understood that various combinations of the structures, components, and/or elements, other than those specifically shown, are contemplated and are within the scope of the present disclosure.

For simplicity and clarity of illustration, the figures depict the general structure and/or manner of construction of the various embodiments described herein. For ease of illustration, the figures depict the different layers/regions of the illustrated magnetoresistive stacks as having a uniform thickness and well-defined boundaries with straight edges. However, a person skilled in the art would recognize that, in reality, the different layers typically have a non-uniform thickness. And, at the interface between adjacent layers, the materials of these layers may alloy together, or migrate into one or the other material, making their boundaries ill-defined. Descriptions and details of well-known features (e.g., interconnects, etc.) and techniques may be omitted to avoid obscuring other features. Elements in the figures are not necessarily drawn to scale. The dimensions of some features may be exaggerated relative to other features to improve understanding of the exemplary embodiments. Cross-sectional views are simplifications provided to help illustrate the relative positioning of various regions/layers and describe various processing steps. One skilled in the art would appreciate that the cross-sectional views are not drawn to scale and should not be viewed as representing proportional relationships between different regions/layers. Moreover, while certain regions/layers and features are illustrated with straight 90-degree edges, in actuality or practice such regions/layers may be more "rounded" and/or gradually sloping.

Further, one skilled in the art would understand that, although multiple layers with distinct interfaces are illustrated in the figures, in some cases, over time and/or exposure to high temperatures, materials of some of the layers may migrate into or interact with materials of other layers to present a more diffuse interface between these layers. It should be noted that, even if it is not specifically mentioned, aspects described with reference to one embodiment may also be applicable to, and may be used with, other embodiments.

Moreover, there are many embodiments described and illustrated herein. The present disclosure is neither limited to any single aspect nor embodiment thereof, nor to any combinations and/or permutations of such aspects and/or embodiments. Moreover, each aspect of the present disclosure, and/or embodiments thereof, may be employed alone or in combination with one or more of the other aspects of the present disclosure and/or embodiments thereof. For the sake of brevity, certain permutations and combinations are not discussed and/or illustrated separately herein. Notably, an embodiment or implementation described herein as "exemplary" is not to be construed as preferred or advantageous, for example, over other embodiments or implementations; rather, it is intended to reflect or indicate that the embodiment(s) is/are "example" embodiment(s). Further, even though the figures and this written disclosure appear to describe the magnetoresistive stacks of the disclosed magnetoresistive devices in a particular order of construction (e.g., from bottom to top), it is understood that the depicted magnetoresistive stacks may have a different order (e.g., the opposite order (i.e., from top to bottom)).

Figure 1:
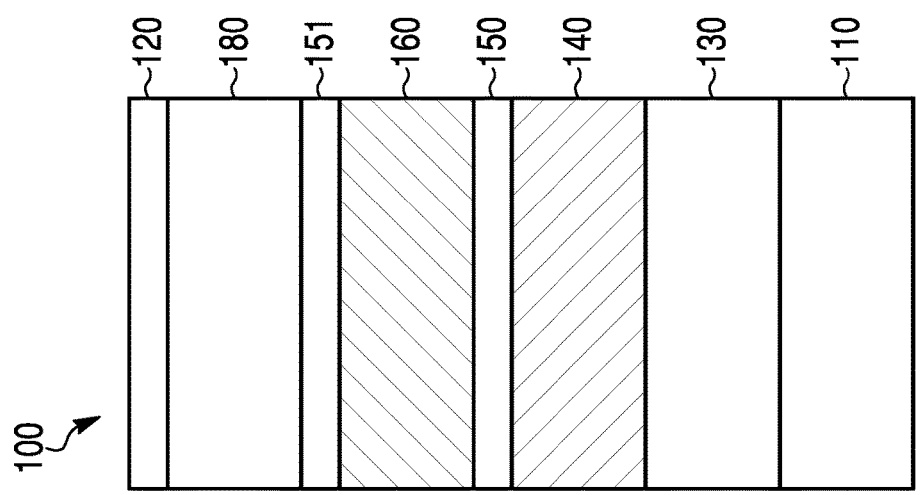
Figure 8:
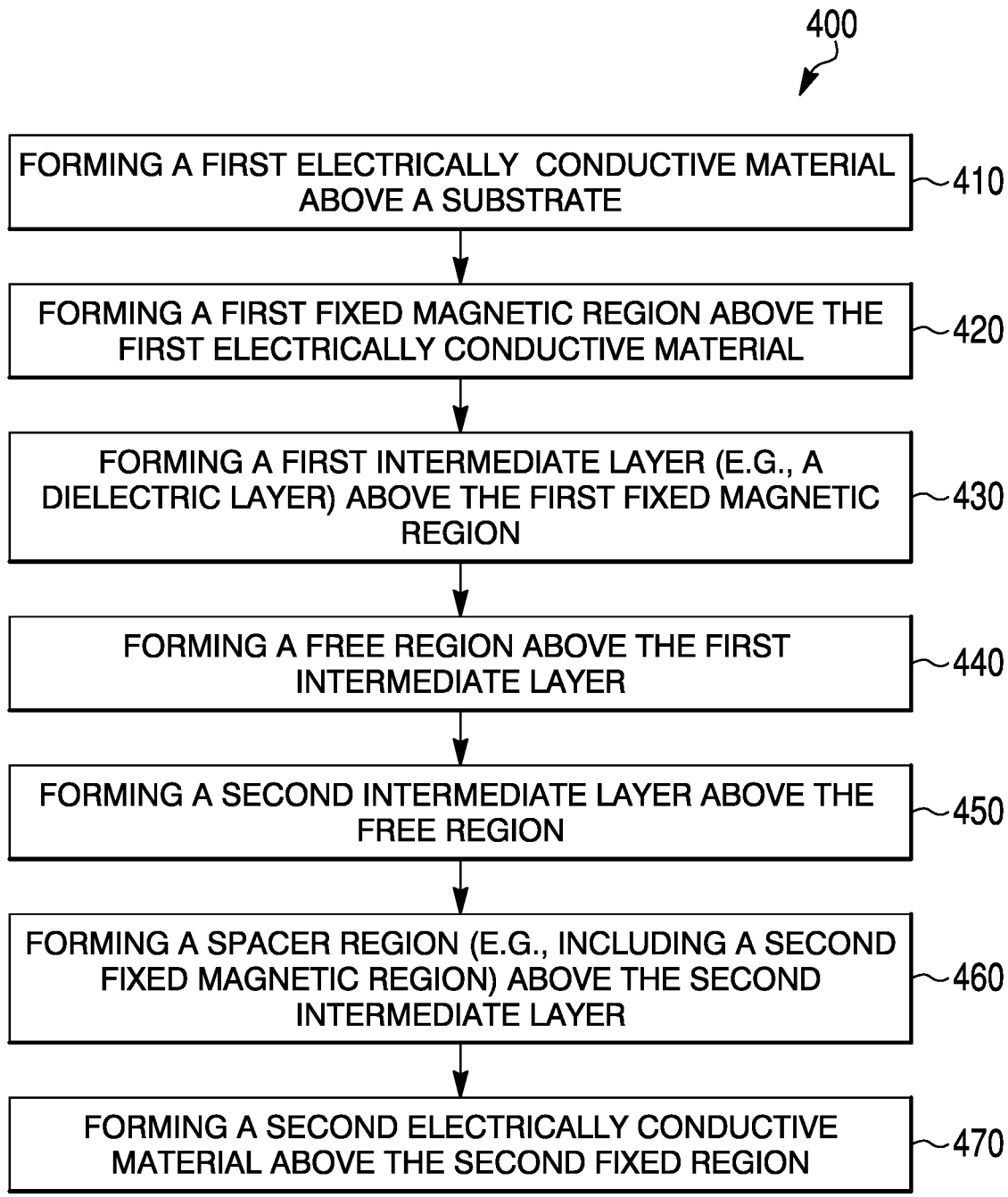
Figure 9A:
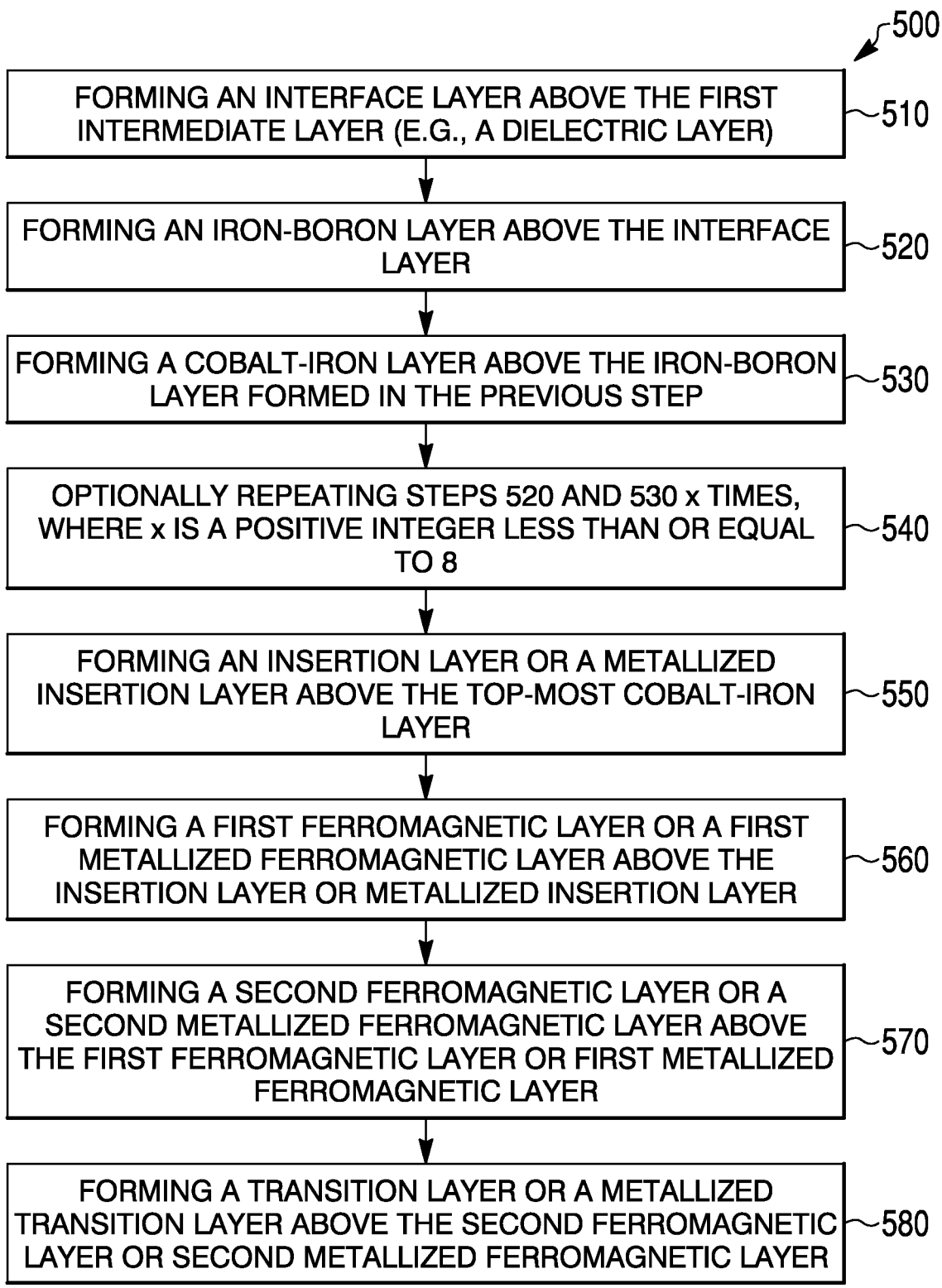
Figure 9B:
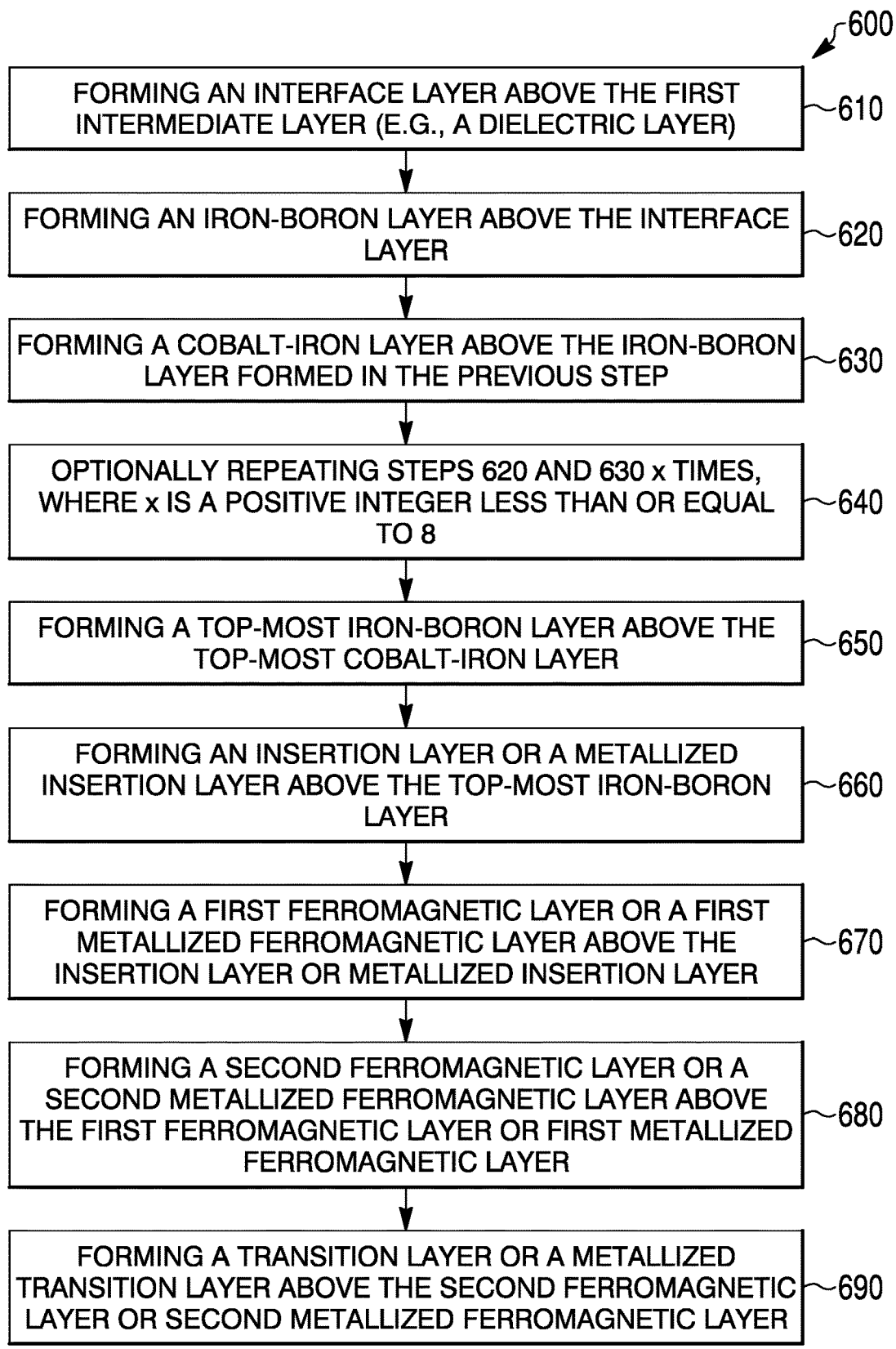
Figure 10:
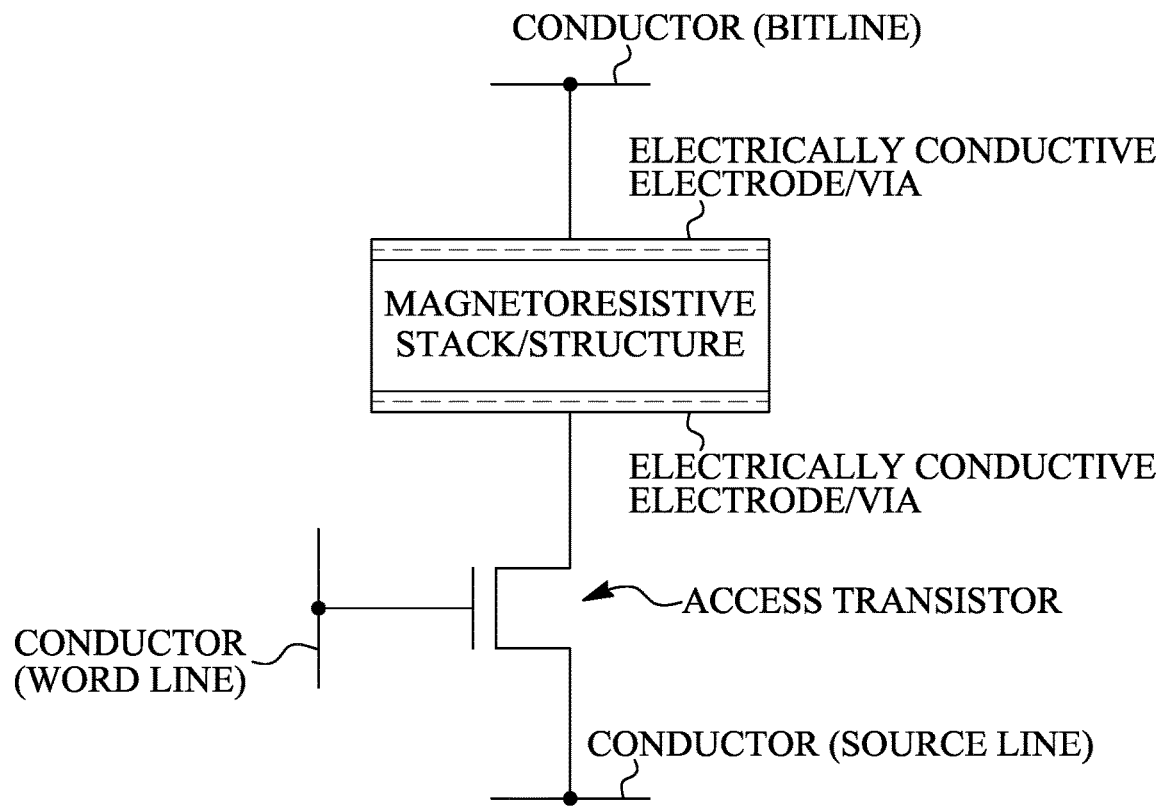
Figure 11A:
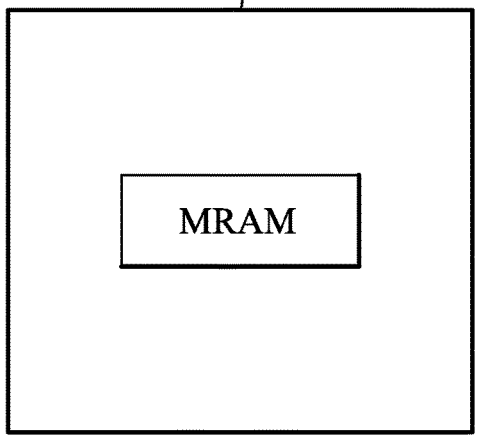
Figure 11B:
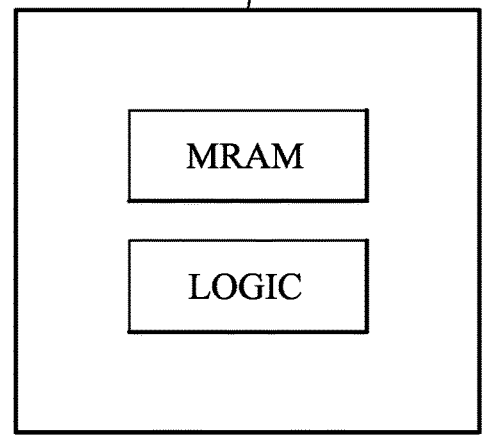
Figure 12A:
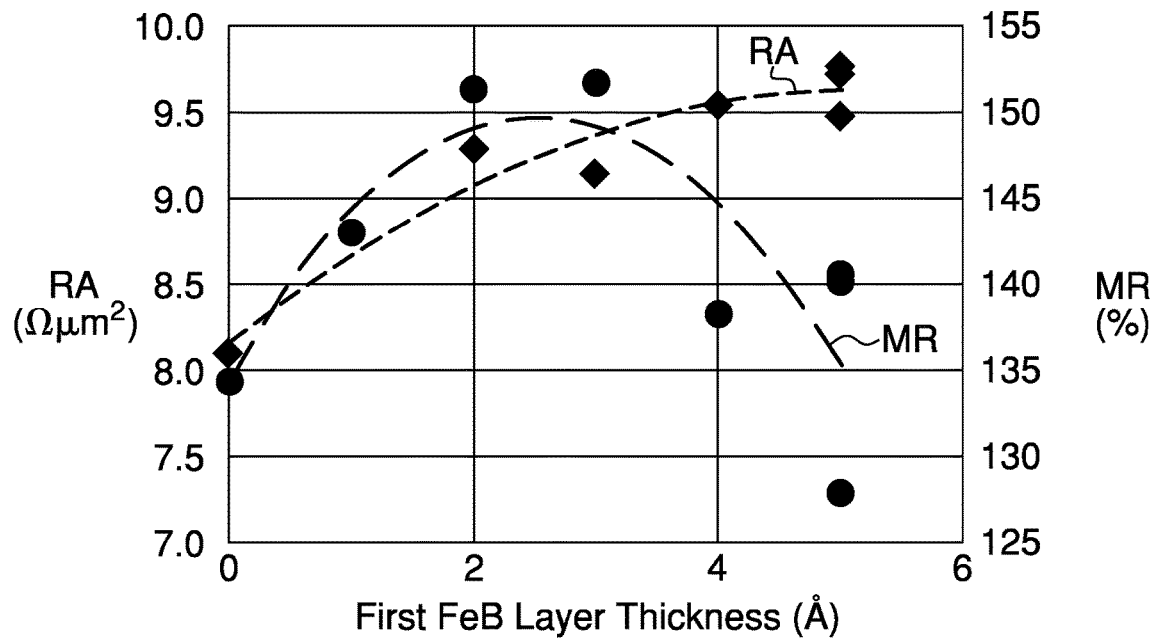
Figure 12B:
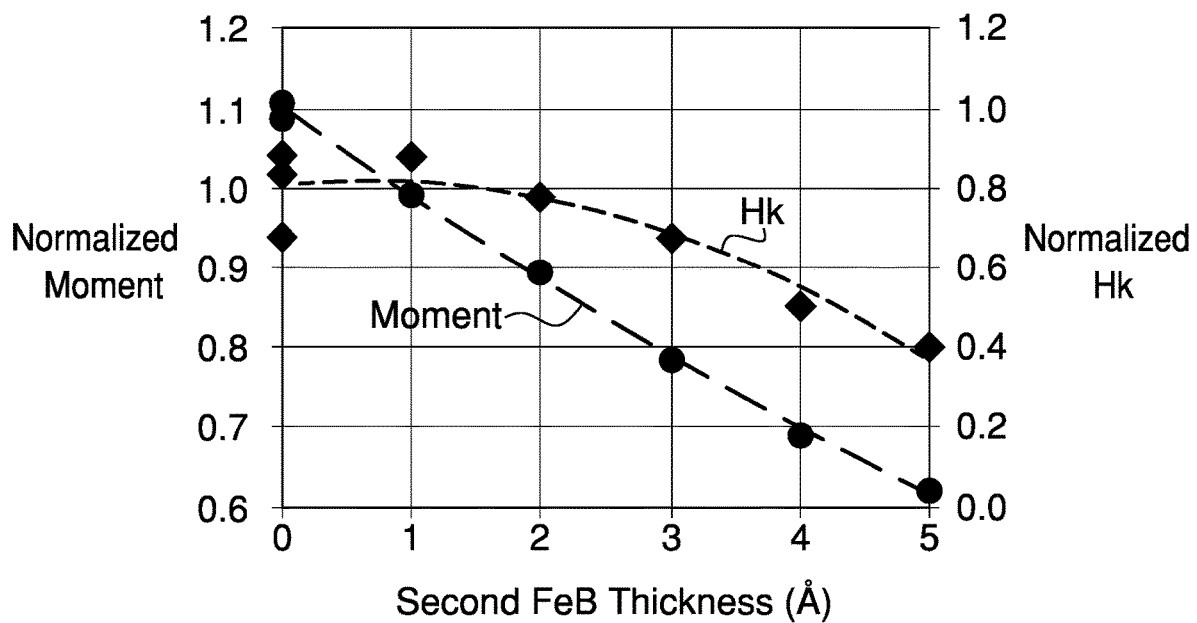
Figure 13A:
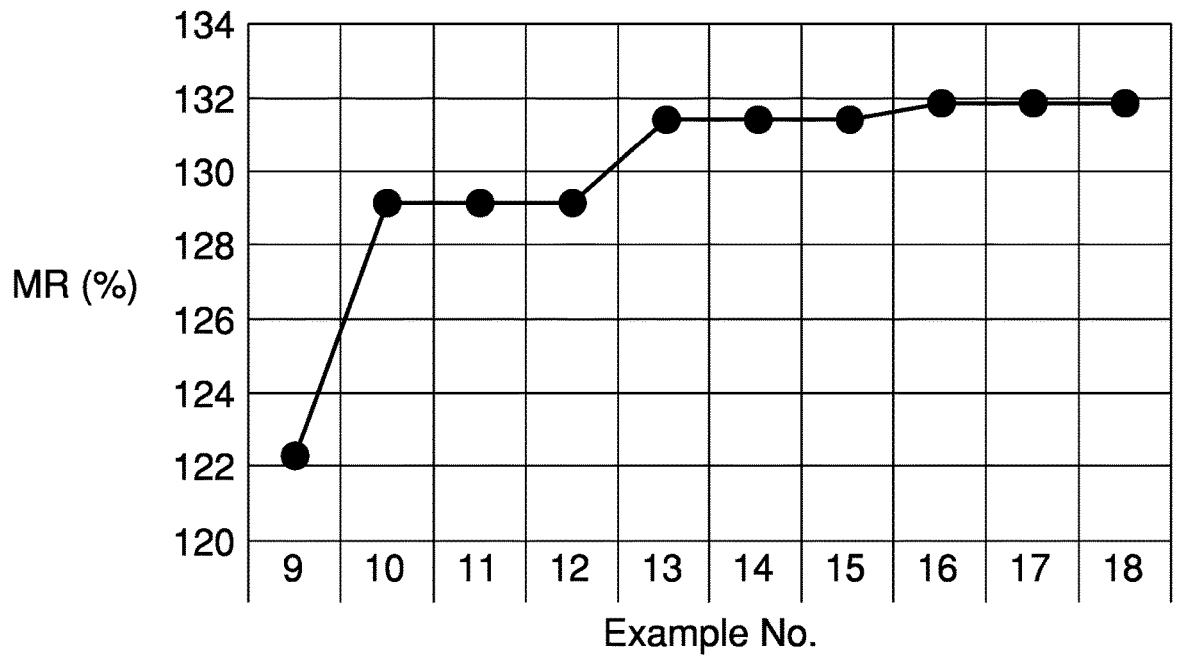
Figure 13B:
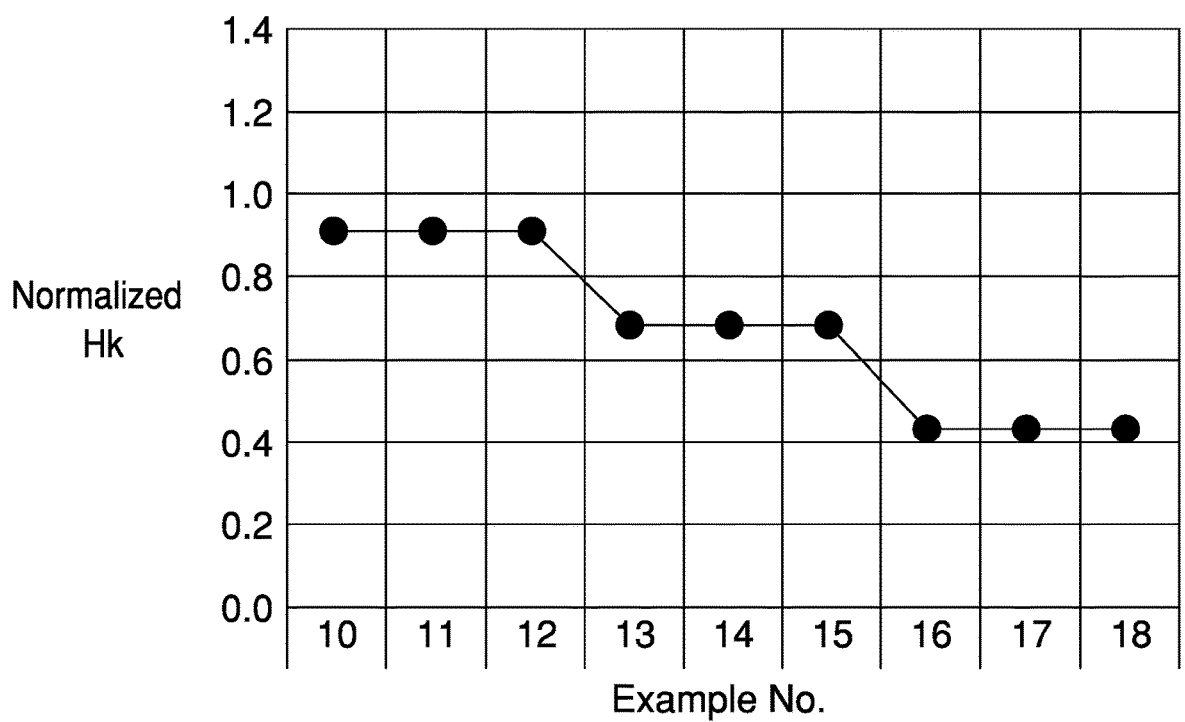
Figure 14A:
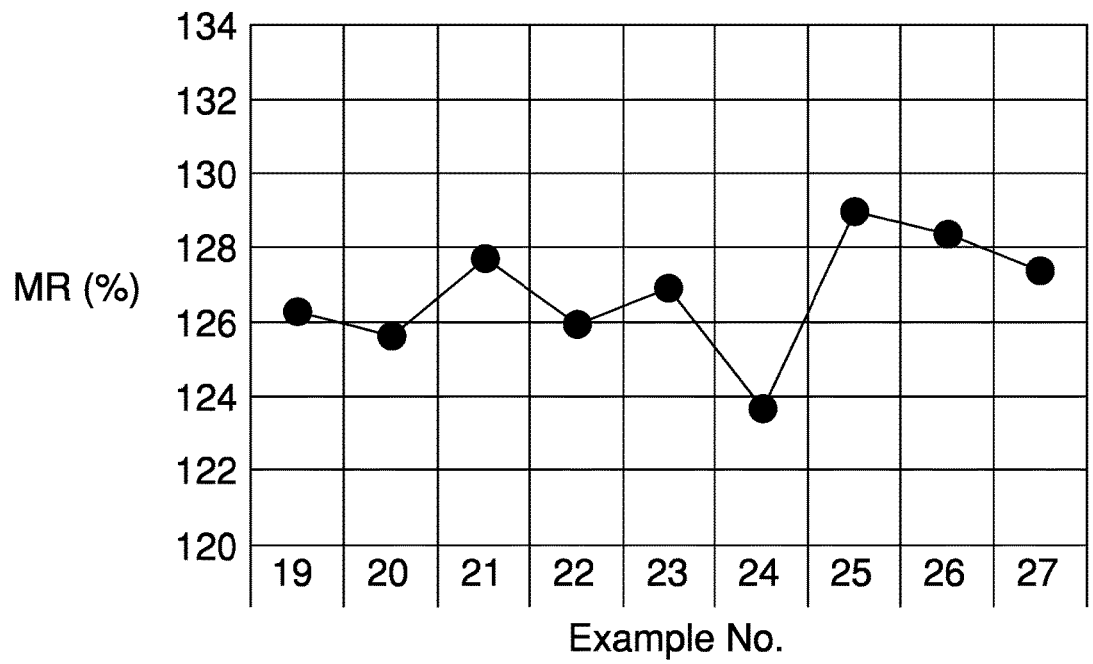
Figure 14B:
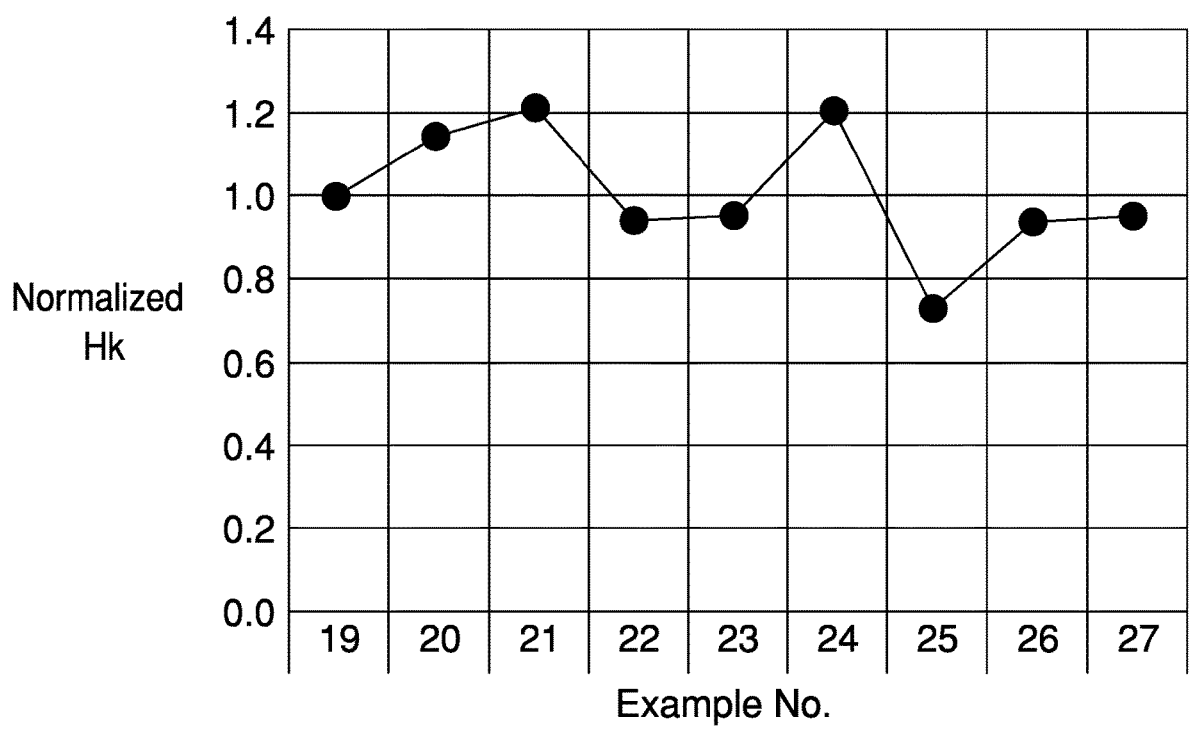

FIG. 1 illustrates a cross-sectional view depicting various regions of an exemplary magnetoresistive stack, according to one or more embodiments of the present disclosure;

FIGS. 2-7 illustrate cross-sectional views depicting various regions of exemplary magnetoresistive stacks, according to one or more embodiments of the present disclosure;

FIG. 8 is a flow chart illustrating an exemplary fabrication process for manufacturing a magnetoresistive device, according to one or more embodiments of the present disclosure;

FIG. 9A is a flow chart illustrating an exemplary fabrication process for manufacturing a free region of a magnetoresistive device, according to one or more embodiments of the present disclosure;

FIG. 9B is a flow chart illustrating an exemplary fabrication process for manufacturing a free region of a magnetoresistive device, according to one or more embodiments of the present disclosure;

FIG. 10 is a schematic diagram of an exemplary magnetoresistive memory stack electrically connected to a select device, e.g., an access transistor, in a magnetoresistive memory cell configuration, according to aspects of certain embodiments of the present disclosure;

FIGS. 11A and 11B are schematic block diagrams of integrated circuits including a discrete memory device and an embedded memory device, each including MRAM (which, in one embodiment is representative of one or more arrays of MRAM having a plurality of magnetoresistive memory stacks, according to aspects of certain embodiments of the present disclosure);

FIG. 12A is a plot of several resistance-area product and magnetoresistance measurements made of magnetoresistive structures, as a function of first iron-boron layer thickness, including corresponding lines of best fit, according to aspects of certain embodiments of the present disclosures;

FIG. 12B is a plot of several magnetic moment and anisotropy field strength measurements made of magnetoresistive structures, as a function of second iron-boron layer thickness, including corresponding lines of best fit, according to aspects of certain embodiments of the present disclosures;

FIG. 13A is a plot of several magnetoresistance measurements made of magnetoresistive structures, according to aspects of certain embodiments of the present disclosures;

FIG. 13B is a plot of several anisotropy field strength measurements made of magnetoresistive structures, according to aspects of certain embodiments of the present disclosures;

FIG. 14A is a plot of several magnetoresistance measurements made of magnetoresistive structures, according to aspects of certain embodiments of the present disclosures; and FIG. 14B is a plot of several anisotropy field strength measurements made of magnetoresistive structures, according to aspects of certain embodiments of the present disclosures.

Again, there are many embodiments described and illustrated herein. The present disclosure is not limited to any single aspect or embodiment thereof, nor is it limited to any combinations and/or permutations of such aspects and/or embodiments. Each of the aspects of the present disclosure, and/or embodiments thereof, may be employed alone or in combination with one or more of the other aspects of the present disclosure and/or embodiments thereof. For the sake of brevity, many of those combinations and permutations are not discussed separately herein.

DETAILED DESCRIPTION

The present disclosure generally relates to magnetoresistive devices having a magnetoresistive stack or structure (for example, part of a magnetoresistive memory device, magnetoresistive sensor/transducer device, etc.) and methods of manufacturing the described magnetoresistive devices. For example, present embodiments describe magnetoresistive stacks including a free region designed to decrease damping forces and/or improve switching efficiency, and methods of manufacturing the magnetoresistive stacks.

It should be noted that all numeric values disclosed herein (including all disclosed thickness values, limits, and ranges) may have a variation of ±10% (unless a different variation is specified) from the disclosed numeric value. For example, a layer disclosed as being "t" units thick can vary in thickness from (t−0.1t) to (t+0.1t) units. Further, all relative terms such as "about," "substantially," "approximately," etc. are used to indicate a possible variation of ±10% (unless noted otherwise or another variation is specified). Moreover, in the claims, values, limits, and/or ranges of thickness and atomic composition of, for example, the described layers/regions, mean the value, limit, and/or range±10%. It should be noted that the exemplary thickness values discussed in this disclosure are expected values (i.e., not measured values) of layer thicknesses immediately after deposition (based on deposition conditions, etc.). As a person of ordinary skill in the art would recognize, these as-deposited thickness values of a layer or region may change (e.g., by inter-layer diffusion, etc.) after further processing (e.g., exposure to high temperatures, etc.).

It should be noted that the description set forth herein is merely illustrative in nature and is not intended to limit the embodiments of the subject matter, or the application and uses of such embodiments. Any implementation described herein as exemplary is not to be construed as preferred or advantageous over other implementations. Rather, the term "exemplary" is used in the sense of example or "illustrative," rather than "ideal." The terms "comprise," "include," "have," "with," and any variations thereof are used synonymously to denote or describe a non-exclusive inclusion. As such, a device or a method that uses such terms does not include only those elements or steps, but may include other elements and steps not expressly listed or inherent to such device or method. Further, the terms "first," "second," and the like, herein do not denote any order, quantity, or importance, but rather are used to distinguish one element from another. Similarly, terms of relative orientation, such as "top," "bottom," etc. are used with reference to the orientation of the structure illustrated in the figures being described. Moreover, the terms "a" and "an" herein do not denote a limitation of quantity, but rather denote the presence of at least one of the referenced item.

It should further be noted that, although exemplary embodiments are described in the context of MTJ stacks/structures, the present inventions may also be implemented in connection with giant magnetoresistive (GMR) stacks/structures where a conductor (e.g., a layer of copper) is disposed between two ferromagnetic regions/layers/materials. Embodiments of the present disclosure may be employed in connection with other types of magnetoresistive stacks/structures where such stacks/structures include a free magnetic region. For the sake of brevity, the discussions and illustrations presented in this disclosure will not be repeated specifically in the context of GMR or other magnetoresistive stacks/structures (e.g., anisotropic magnetoresistive (AMR) devices), but the discussion and drawings described below are to be interpreted as being entirely applicable to GMR and other magnetoresistive stacks/structures (e.g., AMR-type devices).

In this disclosure, the term "region" is used generally to refer to one or more layers. That is, a region (as used herein) may include a single layer (deposit, film, coating, etc.) of material or multiple layers of materials stacked on top of one another (i.e., a multi-layer structure). Further, although in the description below, the different regions and/or layers in the disclosed magnetoresistive devices may be referred to by specific names (e.g., first electrode, second electrode, first intermediate layer, second intermediate layer, fixed region, free region, etc.), this is only for ease of description and not intended as a functional description or relative location/orientation of the layer. Moreover, although the description below and the figures appear to depict a certain orientation of the layers relative to each other, those of ordinary skill in the art will understand that such descriptions and depictions are only exemplary. For example, though a certain first region may be depicted as being "below" a certain second region, in some aspects the entire depicted region may be flipped such that the first region is "above" the second region.

In one aspect, the magnetoresistive devices of the current disclosure include magnetic tunnel junction bits (MTJ bits). These MTJ bits may be formed from a magnetoresistive stack/structure that may include, or may be operably coupled to, one or more electrically conductive electrodes, vias, or conductors on either side of the magnetoresistive stack/structure. As described in greater detail below, the magnetoresistive stack/structure that forms the MTJ bits may include many different regions and/or layers of material, where some of the regions and/or layers include magnetic materials, and whereas other regions and/or layers do not. In at least one embodiment, the methods of manufacturing the disclosed devices may include sequentially depositing, growing, sputtering, evaporating, and/or providing (collectively referred herein as "depositing" or other verb tense (e.g., "deposit" or "deposited")) layers and regions which, after further processing (for example, etching), form an MTJ bit (or a plurality of MTJ bits stacked one on top of another or arranged in an array).

As is known in the art, an electrical resistance of the described MTJ bits may change based on whether the magnetization direction (e.g., the direction of the magnetic moment) of the free region adjacent to the non-magnetic layer (e.g., a dielectric layer serving as a tunnel barrier) is in a parallel alignment or in an antiparallel alignment with the magnetization direction (e.g., the direction of the magnetic moment) of the fixed region adjacent to the non-magnetic layer. Typically, if the two regions have the same magnetization alignment, the resulting relatively low resistance is considered as a digital "0," while, if the alignment is antiparallel, the resulting relatively higher resistance is considered to be a digital "1." A memory device (such as an MRAM) may include multiple such MTJ bits, which may be referred to as memory cells or elements, arranged in an array of columns and rows. By measuring the current through each cell, the resistance of each cell, and thus the data stored in the memory array, can be read.

Magnetoresistive stacks including an iron-boron layer in the free region (e.g., between an insertion layer and an iron-rich layer), may improve the switching efficiency of the magnetoresistive stack. However, a thick iron-boron layer may undesirably increase the resistance-area product (RA) and/or lower the magnetoresistance (MR) of the magnetoresistive stack. Magnetoresistive stacks described herein may include a free region comprising a multi-layer structure between an insertion layer and an interface layer. The multi-layer structure may include three or more layers (e.g., 4 layers, 5 layers, 6 layers, 7 layers, 8 layers, etc.) of alternating iron-boron layers and cobalt-iron layers. Inclusion of the multi-layer structure including one or more iron-boron layers may result in an improved switching efficiency compared to free regions that do not include an iron-boron layer. Additionally, inclusion of the multi-layer structure including one or more iron-boron layers may result in a lesser RA and a greater MR, compared to free regions including a single thick iron-boron layer.

Inclusion of non-magnetic materials in the free region (e.g., inclusion of an insertion layer including one or more non-magnetic materials) may improve the magnetic anisotropy field or tunneling MR of the free region. However, inclusion of such non-magnetic materials increases the inherent damping forces associated with the composition of the free region. Increased damping forces result in an increased critical current, and an increased critical current can result in lower endurance and/or a less reliable magnetoresistive stack. Magnetoresistive stacks described herein may include a free region comprising a metallized insertion layer, and/or one or more metallized layers above the insertion layer (e.g., metallized insertion layer). The inclusion of metals within these layers may result in a lower damping constant for the free region, without negatively affecting the strength of the magnetic anisotropy field or tunneling MR of the free region.

For the sake of brevity, conventional techniques related to semiconductor processing may not be described in detail herein. The exemplary embodiments may be fabricated using any suitable now-known or future-developed processes, such as known lithographic processes. The fabrication of integrated circuits, microelectronic devices, micro electro mechanical devices, microfluidic devices, and photonic devices involves the creation of several layers or regions (e.g., comprising one or more layers) of materials that interact in some fashion. One or more of these regions may be patterned so various regions of the layer have different electrical or other characteristics, which may be interconnected within the region or to other regions to create electrical components and circuits. These regions may be created by selectively introducing or removing various materials.

The patterns that define particular regions of devices according to the present disclosure are often created by lithographic processes. For example, a layer of photoresist may be applied onto a layer overlying a wafer substrate. A photo mask (containing clear and opaque areas) may be used to selectively expose the photoresist by a form of radiation, such as ultraviolet light, electrons, or x-rays. Either the photoresist exposed to the radiation, or not exposed to the radiation, may be removed by the application of a developer. An etch may then be employed/applied whereby the layer (or material) not protected by the remaining resist is patterned. Alternatively, an additive process can be used in which a structure is built up using the photoresist as a template.

As noted above, in one aspect, the described embodiments relate to, among other things, methods of manufacturing magnetoresistive devices, such as, e.g., one or more MTJ stacks. As will be described in greater detail below, embodiments of the present disclosure relate to the formation of a magnetoresistive stack including a free region designed to exhibit improved magnetic properties. The free region may include a metallized insertion layer, one or more metallized ferromagnetic layers and/or a metallized transition layer. In addition, or alternatively, free region may include a multi-layer structure comprising one or more iron-boron layers and/or one or more cobalt-iron layers, between an interface layer and an insertion layer (e.g., metallized insertion layer).

Referring now to FIG. 1, an exemplary magnetoresistive stack 100 is shown, including a fixed magnetic region 140, a free magnetic region 160, and spacer region 180 disposed between a first electrically conductive material 110 (e.g., an electrode, a via, or other conductor) and a second electrically conductive material 120 (e.g., a via or other conductor). In some embodiments, fixed magnetic region 140 is a first fixed magnetic region and spacer region 180 includes a second fixed magnetic region. A seed region 130 may be disposed between the first electrode and the fixed region 140. Magnetoresistive stack 100 may include a first intermediate layer 150 (e.g., made of a dielectric material) disposed between the fixed region 140 and the free region 160 and a second intermediate layer 151 (e.g., also made of a dielectric material) above the free region 160.

In some embodiments, a seed region 130 may be formed directly on or above first electrically conductive material 110. The seed region 130 may act as a surface on which one or more layers of a fixed region 140 may be formed (e.g., directly or indirectly) and allows current to pass bi-directionally from the first electrically conductive material 110 to the fixed region 140. The seed region 130 may include one or more of nickel (Ni), chromium (Cr), cobalt (Co), iron (Fe), or alloys thereof. In some embodiments, the seed region 130 may include an alloy including nickel (Ni) and chromium (Cr), such as, e.g., a NiCr alloy. The seed region 130 may further include one or more other metals or metal alloys, such as, by way of non-limiting example, palladium (Pd), platinum (Pt), nickel (Ni), tantalum (Ta), ruthenium (Ru), tungsten (W), molybdenum (Mo), iron-boron (FeB), cobalt-iron-boron (CoFeB), tantalum-nitride (TaN), or combinations thereof.

In one or more embodiments, a fixed region (e.g., first fixed region 140 or second fixed region) may be a fixed, unpinned synthetic antiferromagnet (SAF) multilayer structure. The fixed, unpinned SAF multilayer structure may include at least two magnetic regions (e.g., made of one or more layers) separated by a coupling region. The one or more magnetic regions may include nickel (Ni), iron (Fe), and cobalt (Co), palladium (Pd), platinum (Pt), chromium (Cr), manganese (Mn), magnesium (Mg), and alloys or combinations thereof. The coupling region may be an anti-ferromagnetic coupling region that includes non-ferromagnetic materials such as, for example, iridium (Ir), ruthenium (Ru), rhenium (Re), or rhodium (Rh). In some embodiments, one or more magnetic regions may comprise a magnetic multilayer structure that includes a plurality of layers of a first ferromagnetic material (e.g., cobalt (Co)), a second ferromagnetic material (e.g., nickel (Ni)), and/or a paramagnetic material (e.g., platinum (Pt)).

Additionally, or in the alternative, in some embodiments, the fixed region (e.g., first fixed region 140) may include one or more synthetic ferromagnetic structures (SyF). Since SyFs are known to those skilled in the art, they are not described in greater detail herein. In some embodiments, the fixed region 140 may have a thickness of approximately 8 Å to approximately 300 Å, approximately 15 Å to approximately 110 Å, greater than or equal to 8 Å, greater than or equal to 15 Å, less than or equal to 300 Å, or less than or equal to 110 Å. In some embodiments, spacer region 180 includes a second fixed region that may have a thickness of approximately 8 Å to approximately 300 Å, approximately 15 Å to approximately 110 Å, greater than or equal to 8 Å, greater than or equal to 15 Å, less than or equal to 300 Å, or less than or equal to 110 Å.

First intermediate layer 150 and second intermediate layer 151 may include a metal oxide or other material capable of forming a tunnel barrier of a magnetic tunnel junction including free region 160. For example, first intermediate layer 150 and second intermediate layer 151 may both comprise magnesium oxide (MgO), aluminum oxide (AlOx), or a combination thereof. In some embodiments, first intermediate layer 150 has a different composition than second intermediate layer 151. First intermediate layer 150 may have a thickness of approximately 6 Å to approximately 20 Å, such as, for example, approximately 8 Å to approximately 16 Å. Second intermediate layer 151 may have a thickness of approximately 5 Å to approximately 18 Å, such as, for example, approximately 7 Å to approximately 15 Å.

Figure 2:
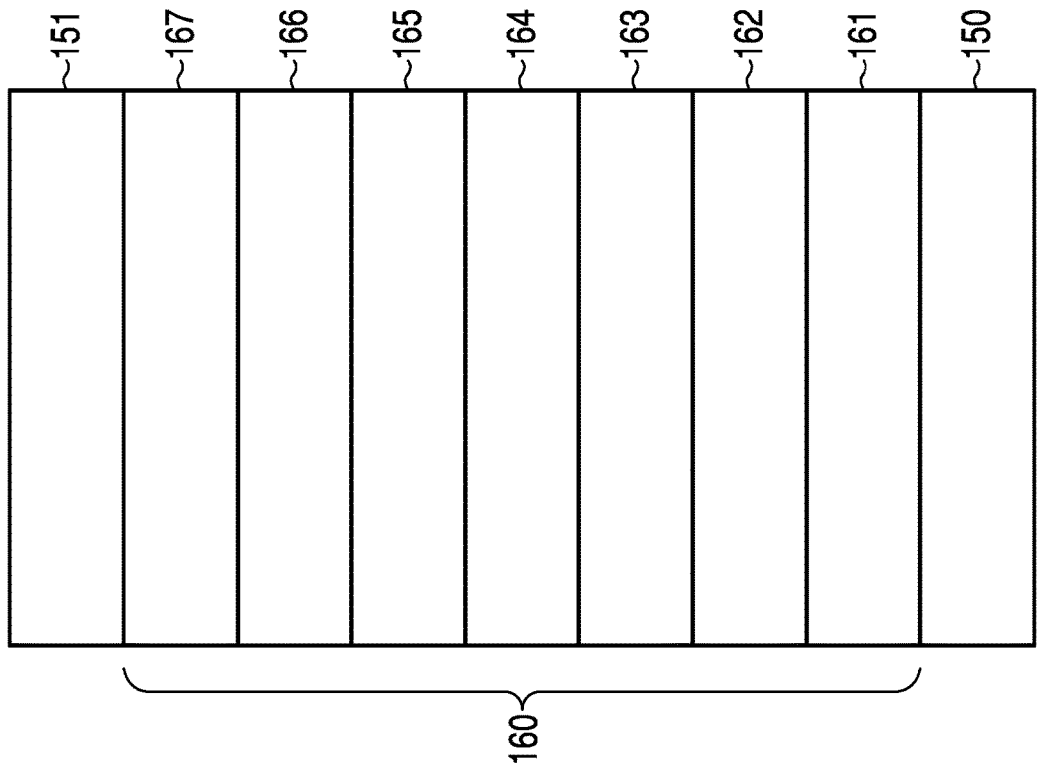

Referring to FIG. 2, free region 160 may include an interface layer 161. Interface layer 161 may be formed above and in contact with the first intermediate layer 150. One or more iron-boron (FeB) layers 162, and one or more cobalt-iron (CoFe) layers 163 may be formed above interface layer 161. For example, in the embodiment shown in FIG. 2, an iron-born layer 162 is formed above and in contact with the interface layer 161, a cobalt-iron layer 163 is formed above and in contact with the iron-born layer 162.

Interface layer 161 may comprise predominantly iron (Fe) (e.g., interface layer 161 may have a composition including at least 50 atomic percent (at. %) iron, or greater than 50 at. % iron). In some embodiments, interface layer 161 comprises at least approximately 75 at. % iron, such as, for example, at least approximately 90 at. % iron. Interface layer 161 may also comprise one or more additional elements, such as, for example: cobalt (Co) and/or nickel (Ni). Interface layer 161 may have a thickness of approximately 1 Å to approximately 5 Å, such as, for example, approximately 1 Å to approximately 3 Å.

As used herein, the terms "cobalt-iron layer," and "iron-boron layer" are relative terms used to clarify different types of layers within free region 160 of magnetoresistive stack 100. These terms do not necessarily connote a composition of such layers. In some embodiments, iron-boron layer 162 may comprise at least approximately 60 at. % of an alloy including iron and boron (e.g., FeB), wherein the alloy includes approximately 30 to approximately 60 at. % boron (B), such as, for example, approximately 40 at. % to approximately 55 at. % boron (B). In some embodiments, the iron-boron layer 162 may have a boron (B) content sufficient to result in the iron-boron layer 162 being non-magnetic. Iron-boron layer 162 may also comprise one or more additional elements, such as, for example: cobalt (Co), carbon (C), or a combination thereof.

Cobalt-iron layer 163 may comprise at least 60 at. % of an alloy including cobalt and iron (e.g., CoFe), wherein the alloy includes approximately 10 at. % to approximately 75 at. % iron (Fe), such as, for example, approximately 15 at. % to approximately 40 at. %. iron (Fe). Cobalt-iron layer 163 may also comprise one or more additional elements, such as, for example: nickel (Ni), tantalum (Ta), titanium (Ti), tungsten (W), vanadium (V), carbon (C), or a combination thereof.

In embodiments where free region 160 includes exactly one iron-boron layer 162 and exactly one cobalt-iron layer 163 (see, e.g., FIG. 2), the iron-boron layer 162 may have a thickness of approximately 3 Å to approximately 8 Å, such as, for example, approximately 4 Å, and the cobalt-iron layer 163 may have a thickness of approximately 3 Å to approximately 7 Å, such as, for example, approximately 5 Å.

Still referring to FIG. 2, free region 160 may include an insertion layer 164 above the iron-boron layer(s) 162 and cobalt-iron layer(s) 163. Insertion layer 164 may comprise molybdenum (Mo), tungsten (W), tantalum (Ta), or a combination thereof. Insertion layer 164 may have a thickness of approximately 2 Å to approximately 6 Å, such as, for example, approximately 2.5 Å to approximately 4.5 Å.

Free region 160 may include one or more layers of ferromagnetic material (e.g., first ferromagnetic layer 165 and/or second ferromagnetic layer 166) above insertion layer 164. First ferromagnetic layer 165 may include cobalt, iron, boron, alloys comprising cobalt, iron, and/or boron (e.g., CoFe, CoFeB, etc.), or a combination thereof. Second ferromagnetic layer 166 may include cobalt, iron, boron, alloys comprising cobalt, iron, and/or boron (e.g., CoFe, CoFeB, etc.), or a combination thereof. In some embodiments, first ferromagnetic layer 165 has the same composition as second ferromagnetic layer 166. In other embodiments, first ferromagnetic layer 165 has a different composition than second ferromagnetic layer 166. For example, first ferromagnetic layer 165 may include an alloy comprising cobalt and iron, and second ferromagnetic layer 166 may include an alloy comprising cobalt, iron, and boron.

First ferromagnetic layer 165 may have a thickness of approximately 1.5 Å to approximately 11 Å, such as, for example, approximately 2 Å to approximately 8 Å or approximately 2.5 Å to approximately 7 Å. Second ferromagnetic layer 166 may have a thickness of approximately 1 Å to approximately 6 Å, such as, for example, approximately 1.5 Å to approximately 4 Å or approximately 2 Å to approximately 3.5 Å.

Free region 160 may include a transition layer 167 above first ferromagnetic layer 165 and second ferromagnetic layer 166. Transition layer 167 may comprise iron (Fe), cobalt (Co), alloys including one or more of iron (Fe) and cobalt (Co), or combinations thereof. Transition layer 167 may have a thickness of approximately 1.0 Å to approximately 5.0 Å, such as, for example, approximately 1.5 Å to approximately 3.5 Å.

As described above, a magnetoresistive stack 100 may comprise a free region 160, where the free region 160 is disposed between first intermediate layer 150 and second intermediate layer 151. Notwithstanding the specific construction of free magnetic region 160, free magnetic region 160 may include a magnetic vector (or moment) that can be moved or switched by applied magnetic fields or spin transfer torque. Free region 160 also may include one or more synthetic anti-ferromagnetic (SAF) or synthetic ferromagnet (SyF) structures.

In some embodiments, free region 160 is in contact with both first intermediate layer 150 and second intermediate layer 151. For example, transition layer 167 may be in contact with second intermediate layer 151 and interface layer 161 may be in contact with first intermediate layer 150.

Additional elements may be added to the layers of free region 160 to provide improved magnetic, electrical, or microstructural properties. For example, the inclusion of additional metals within free region 160, can reduce the damping force of free region 160, resulting in a reduction in the magnitude of the critical current of the magnetoresistive stack 100. Additionally or alternatively, inclusion of additional metals within insertion layer 164 may allow for a thicker insertion layer, without increasing the damping force of free region 160. In some embodiments, metals may be incorporated into the composition of insertion layer 164, first ferromagnetic layer 165, second ferromagnetic layer 166, transition layer 167, or a combination thereof, reducing the damping force of free region 160.

Referring to FIG. 3, free region 160 may include a metallized insertion layer 264, a first metallized ferromagnetic layer 265, a second metallized ferromagnetic layer 266, and a metallized transition layer 267. In addition to one or more of molybdenum, tungsten, or tantalum, metallized insertion layer 264 may include one or more additional metals. For example, metallized insertion layer 264 may include cobalt (Co), nickel (Ni), iron (Fe), titanium (Ti), chromium (Cr), vanadium (V), manganese (Mn), niobium (Nb), gold (Au), copper (Cu), silver (Ag), rhodium (Rh), palladium (Pd), or a combination thereof. The amount of additional metal (e.g., amount of cobalt, nickel, iron, titanium, chromium, vanadium, manganese, niobium, gold, copper, silver, rhodium, and/or palladium) in metallized insertion layer 264 may be less than or equal to about 35 at. %, such as, for example, less than or equal to about 25 at. %, less than or equal to about 15 at. %, less than or equal to about 10 at. %, about 3 at. % to about 35 at. %, or about 3 at. % to about 15 at. %.

First metallized ferromagnetic layer 265 may include one or more of cobalt, iron, and/or boron, and one or more additional metals. For example, first metallized ferromagnetic layer 265 may include chromium, vanadium, manganese, niobium, tantalum, tungsten, gold, copper, silver, rhodium, palladium, or a combination thereof. The amount of additional metal (e.g., amount of chromium, vanadium, manganese, niobium, tantalum, tungsten, gold, copper, silver, rhodium, and/or palladium) in first metallized ferromagnetic layer 265 may be less than or equal to about 15 at. % such, as for example, less than or equal to about 10 at. %, about 3 at. % to about 15 at. %, or about 3 at. % to about 10 at. %.

Second metallized ferromagnetic layer 266 may include one or more of cobalt, iron, and/or boron, and one or more additional metals. For example, second metallized ferromagnetic layer 266 may include chromium, vanadium, manganese, niobium, tantalum, tungsten, gold, copper, silver, rhodium, palladium, or a combination thereof. The amount of additional metal (e.g., amount of chromium, vanadium, manganese, niobium, tantalum, tungsten, gold, copper, silver, rhodium, and/or palladium) in second metallized ferromagnetic layer 266 may be less than or equal to about 15 at. % such, as for example, less than or equal to about 10 at. %, about 3 at. % to about 15 at. %, or about 3 at. % to about 10 at. %.

Metallized transition layer 267 may include iron, and one or more additional metals. For example, metallized transition layer 267 may include chromium, vanadium, manganese, niobium, tantalum, tungsten, gold, copper, silver, rhodium, palladium, or a combination thereof. The amount of additional metal (e.g., amount of chromium, vanadium, manganese, niobium, tantalum, tungsten, gold, copper, silver, rhodium, and/or palladium) in metallized transition layer 267 may be less than or equal to about 15 at. % such, as for example, less than or equal to about 10 at. %, about 3 at. % to about 15 at. %, or about 3 at. % to about 10 at. %.

As shown in FIG. 3, free region 160 may include four metallized layers (e.g., metallized insertion layer 264, first metallized ferromagnetic layer 265, second metallized ferromagnetic layer 266, and metallized transition layer 267) above the cobalt-iron layer(s) 163 and iron-boron layer(s)

162. In other embodiments, a free region 160 may include one, two, or three metallized layers above the cobalt-iron layer(s) 163 and iron-boron layer(s) 162. For example, referring to the free region 160 shown in FIG. 2, a metallized layer may be substituted in place of a corresponding layer (e.g., metallized insertion layer 264 substituted in place of insertion layer 164, first metallized ferromagnetic layer 265 substituted in place of first ferromagnetic layer 165, second metallized ferromagnetic layer 266 substituted in place of second ferromagnetic layer 166, and/or metallized transition layer 267 substituted in place of transition layer 167). In some situations, it may be preferable to include a greater additional metal content in layers that are farther away from intermediate layer 150. Arranging the additional metal content of the layers of free region 160 above of the cobalt-iron layer(s) 163 and iron-boron layer(s) 162 in this manner may minimize decreases to the magnetoresistance of the magnetoresistive stack 100 caused by the inclusion of metallized layers within free region 160.

In some embodiments, the layers of free region 160 below insertion layer 164 or metallized insertion layer 264 may be configured to improve spin-transfer torque switching efficiency. For example, a free region 160 including an iron-boron layer 162 that is thicker than an overlying cobalt-iron layer 163 may have improved switching efficiency compared to some free region 160 compositions. However, a thick (e.g., greater than about 5 Å) iron-boron layer 162 proximate to intermediate layer 150 may create undesirable increases in the resistance-area product and/or decreases in magnetoresistance, of magnetoresistive stack 100.

As shown in FIGS. 4-7, free region 160 may comprise a multilayer structure 360 below insertion layer 164 or metallized insertion layer 264. The multilayer structure 360 includes one or more iron-boron layers 162 and one or more cobalt-iron layers 163. The multilayer structure 360 may improve the switching efficiency, while mitigating any negative effect of the iron-boron layer(s) 162 on the resistance-area product and magnetoresistance, of magnetoresistive stack 100, compared to magnetoresistive stacks 100 including exactly one iron-boron layer 162 and exactly one cobalt-iron layer 163.

Figure 5:
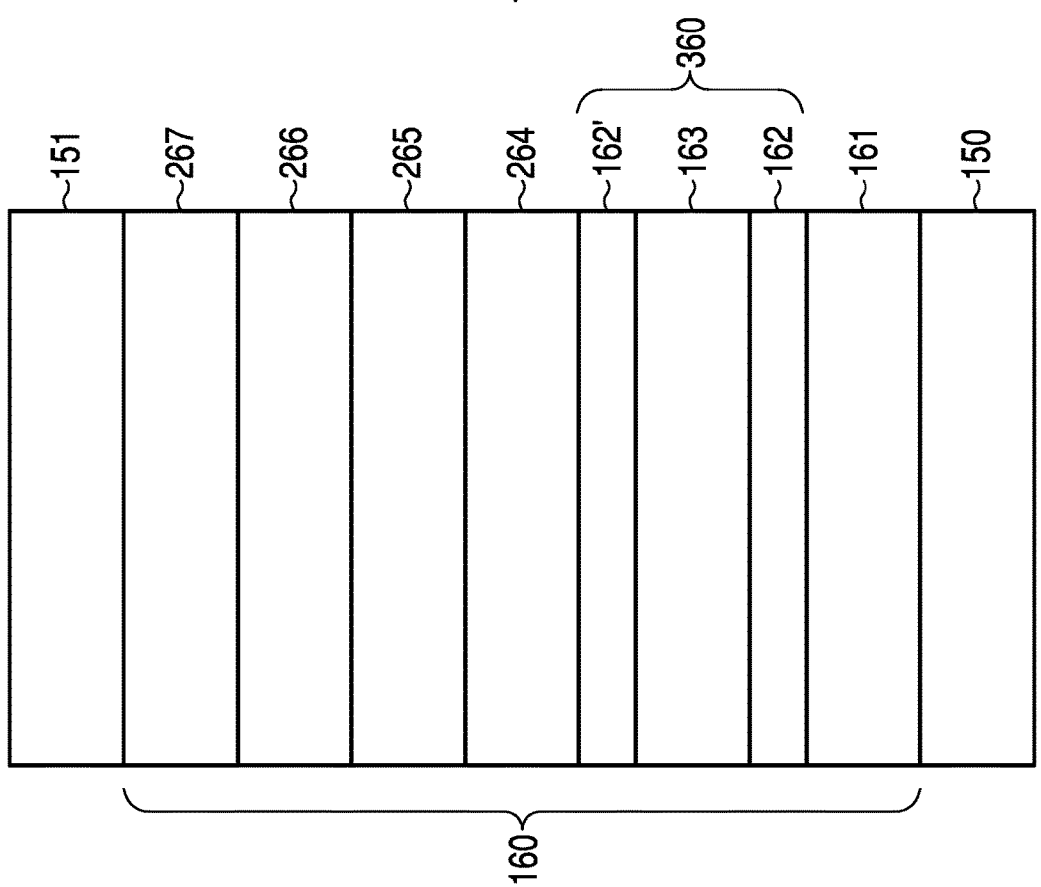

Referring to FIGS. 4 and 5, free region 160 may include an interface layer 161, a first iron-boron layer 162 above the interface layer 161, a cobalt-iron layer 163 above the first iron-boron layer 162, and a second iron-boron layer 162' above the cobalt-iron layer 163.

As shown in FIG. 4, free region 160 may include an insertion layer 164 above and in contact with the top layer of multilayer structure 360 (e.g., second iron-boron layer 162'). As shown in FIG. 5, free region 160 may include a metallized insertion layer 264 above and in contact with the top layer of multilayer structure 360 (e.g., second iron-boron layer 162').

Figure 6:
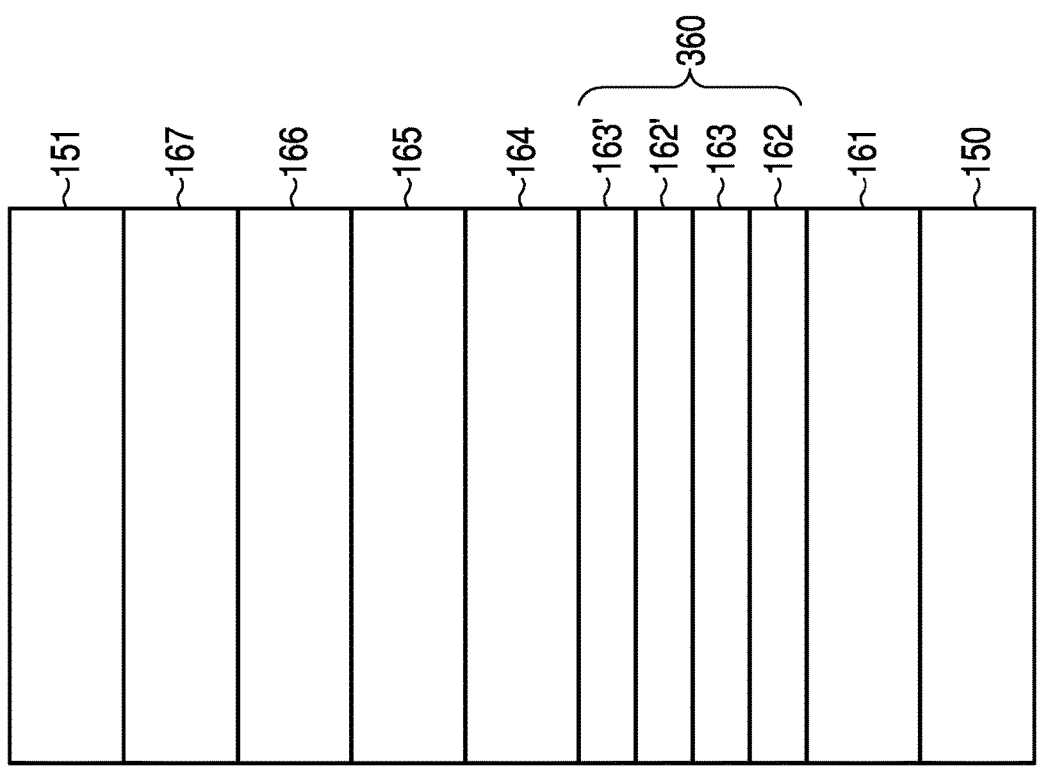
Figure 7:
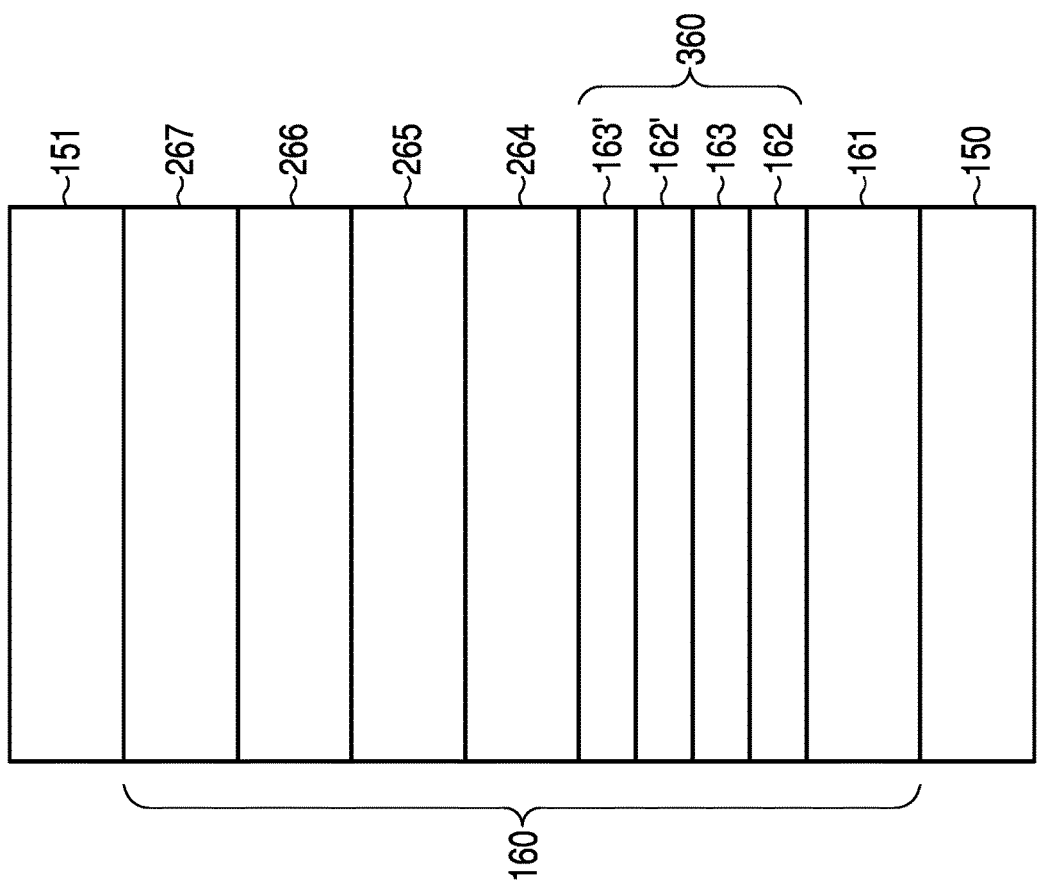

Referring to FIGS. 6 and 7, free region 160 may include an interface layer 161, a first iron-boron layer 162 above the interface layer 161, a first cobalt-iron layer 163 above the first iron-boron layer 162, a second iron-boron layer 162' above the first cobalt-iron layer 163, and a second cobalt-iron layer 163' above the second iron-boron layer 162'.

As shown in FIG. 6, free region 160 may include an insertion layer 164 above and in contact with the top layer of multilayer structure 360 (e.g., second cobalt-iron layer 163'). As shown in FIG. 7, free region 160 may include a metallized insertion layer 264 above and in contact with the top layer of multilayer structure 360 (e.g., second cobalt-iron layer 163').

In embodiments where free region 160 includes more than one iron-boron layer 162 and/or more than one cobalt-iron layer 163 (such as, for example, the embodiments shown in FIGS. 4-7), each iron-boron layer 162 (e.g., first iron-boron layer 162 and second iron-boron layer 162') may have a thickness of approximately 1 Å to approximately 6 Å (e.g., approximately 2 Å or approximately 4 Å), and each cobalt-iron layer 163 (e.g., first cobalt-iron layer 163 and second cobalt-iron layer 163') may have a thickness of approximately 2 Å to approximately 5 Å.

In some embodiments, layers and regions of magnetoresistive stack 100, including layers of free region 160 may be deposited using any technique now known or later developed. In some embodiments, one or more of layers of the free region 160 may be deposited using a "heavy" inert gas (e.g., xenon (Xe), argon (Ar), krypton (Kr)), at room temperature, approximately 25° C., approximately 15° C. to approximately 40° C., approximately 20° C. to approximately 30° C. In some embodiments, one or more of the layers of free region 160 may be deposited using a "heavy" inert gas (e.g., xenon (Xe), argon (Ar), krypton (Kr)), at temperatures greater than approximately 25° C., such as, for example, greater than approximately 150° C.

The various regions or layers of magnetoresistive stack 100 may be deposited individually during manufacture. However, as would be recognized by those of ordinary skill in the art, the materials that make up the various regions may alloy with (intermix with and/or diffuse into) the materials of adjacent regions during subsequent processing (e.g., deposition of overlying layers, high temperature or reactive etching technique, and/or annealing).

Exemplary methods for forming a magnetoresistive stack 100 according to embodiments of the present disclosure will now be discussed, and reference to parts and the numbered labels shown in FIGS. 1-7 may be made.

FIG. 8 is a flow chart of a method 400 of manufacturing a magnetoresistive stack 100, according to the present disclosure. A first electrically conductive material 110 (e.g., an electrode, via, and/or conductor) may be formed above a substrate, such as, for example, a silicon-based substrate (step 410). A first fixed magnetic region 140 (e.g., a SAF) may then be formed above the first electrically conductive material 110 (step 420). Optionally, a seed region 130 may be formed on the first electrically conductive material 110, prior to step 420. A first intermediate layer 150 (e.g., a dielectric layer) may then be formed above the first fixed magnetic region 140 (step 430). A free region 160 may be formed above the first intermediate layer 150 (step 440). A second intermediate layer 151 may then be formed above the free region 160 (step 450). A spacer region 180 (e.g., including a secondary fixed magnetic region) may then be formed above the second intermediate layer 151 (step 460). A second electrically conductive material 120 (e.g., an electrode, via, and/or conductor) may also be formed, thereby providing electrical connectivity to magnetoresistive stack 100 (step 470).

The steps involved in formation of free region 160 may vary, depending on the design of free region 160. FIGS. 9A-9B are flow charts of methods 500, 600 of manufacturing free region 160 (i.e., step 440 of method 400), according to one or more aspects of the present disclosure. Starting from FIG. 9A, a method 500 of forming a free region 160 (as shown in FIGS. 6 and 7) may include forming an interface layer 161 above the first intermediate layer 150 (e.g., a dielectric layer) (step 510). After an interface layer 161 is formed, a first iron-boron layer 162 may be formed above the interface layer 161 (step 520). Next, a first cobalt-iron layer 163 may be formed above the underlying iron-boron layer 162 (step 530). Optionally, steps 520 and 530 may be repeated once, twice, or three or more times to form subsequent iron-boron layer(s) 162 and subsequent cobalt-iron layer(s) 163 (e.g., second iron-boron layer 162' and second cobalt-iron layer 163') (step 540). After the top-most cobalt-iron layer 163 (e.g., second cobalt-iron layer 163') is formed, an insertion layer 164 or a metallized insertion layer 264 may be formed over the top-most cobalt-iron layer 163 (step 550). A first ferromagnetic layer 165 or a first metallized ferromagnetic layer 265 may then be formed over the insertion layer 264 or metallized insertion layer 264 (step 560). A second ferromagnetic layer 166 or second metallized ferromagnetic layer 266 may then be formed over the first ferromagnetic layer 165 or first metallized ferromagnetic layer 265 (step 570). A transition layer 167 or metallized transition layer 267 may then be formed over the second ferromagnetic layer 166 or second metallized ferromagnetic layer 266 (step 580).

Referring to FIG. 9B, a method 600 of forming a free region 160 (e.g., as shown in FIGS. 4 and 5) may include forming an interface layer 161 above the first intermediate layer 150 (e.g., a dielectric layer) (step 610). After an interface layer 161 is formed, a first iron-boron layer 162 may be formed above the interface layer 161 (step 620). Next, a first cobalt-iron layer 163 may be formed above the underlying iron-boron layer 162 (step 630). Optionally, steps 620 and 630 may be repeated once, twice, or three or more times to form subsequent iron-boron layer(s) 162 and subsequent cobalt-iron layer(s) 163 (e.g., second iron-boron layer 162' and second cobalt-iron layer 163') (step 640). After the top-most cobalt-iron layer 163 (e.g., cobalt-iron layer 163) is formed, the top-most iron-boron layer 162 (e.g., second iron-boron layer 162') may be formed above the top-most cobalt-iron layer 163 (step 650). An insertion layer 164 or a metallized insertion layer 264 may be formed over the top-most iron-boron layer 162 (step 660). A first ferromagnetic layer 165 or a first metallized ferromagnetic layer 265 may then be formed over the insertion layer 264 or metallized insertion layer 264 (step 670). A second ferromagnetic layer 166 or second metallized ferromagnetic layer 266 may then be formed over the first ferromagnetic layer 165 or first metallized ferromagnetic layer 265 (step 680). A transition layer 167 or metallized transition layer 267 may then be formed over the second ferromagnetic layer 166 or second metallized ferromagnetic layer 266 (step 690).

While the steps of methods 400, 500, and 600 have been depicted in a particular order, it is to be understood by those of ordinary skill in the art that such steps may be performed in any suitable order (e.g., in reverse order). Additionally, steps may be repeated, added, or omitted according to techniques known in the art.

Since suitable integrated circuit fabrication techniques (e.g., deposition, sputtering, evaporation, plating, etc.) that may be used to form the different regions are known to those of ordinary skill in the art, they are not described here in great detail. It should be noted that while not specifically described, various deposition processes (e.g., any physical vapor deposition (PVD) or chemical vapor deposition (CVD) process known in the art, such as sputtering, magneton sputtering, ion beam deposition, atomic layer deposition, evaporative techniques, etc.) may be used to form the various layers of the exemplary magnetoresistive stacks 100 and free regions 160 thereof. Further, various lithographic processes, etching processes, or finishing steps common in the art (e.g., ion beam etching, chemical etching, chemical-physical planarization) may be performed after the formation of one or more layers of the exemplary magnetoresistive stacks.

In some embodiments, forming some of the regions may involve thin-film deposition processes, including, but not limited to, physical vapor deposition techniques such as ion beam sputtering and magnetron sputtering. Forming thin insulating layers may involve physical vapor deposition from an oxide target, such as by radio-frequency (RF) sputtering, or by deposition of a thin metallic film followed by an oxidation step, such as oxygen plasma oxidation, oxygen radical oxidation, or natural oxidation by exposure to a low-pressure oxygen environment. In some embodiments, formation of some or all of the regions of a magnetoresistive stack may also involve known processing steps such as, for example, selective deposition, photolithography processing, etching, etc., in accordance with any of the various conventional techniques known in the semiconductor industry.

In some embodiments, during deposition of the disclosed fixed and free regions (e.g., first fixed region 140, free region 160, and/or second fixed region), a magnetic field may be provided to set a preferred easy magnetization axis of the region (e.g., via induced anisotropy). Similarly, a strong magnetic field applied during the post-deposition high-temperature anneal step may be used to induce a preferred easy magnetization axis and a preferred pinning direction for any antiferromagnetically pinned materials.

As alluded to above, the magnetoresistive devices of the present disclosure, including one or more exemplary free regions 160 described herein, may be implemented in a sensor architecture or a memory architecture (among other architectures). For example, in a memory configuration, the magnetoresistive devices, including an example magnetoresistive stack 100 described herein, may be electrically connected to an access transistor and configured to couple or connect to various conductors, which may carry one or more control signals, as shown in FIG. 10. The magnetoresistive devices of the current disclosure may be used in any suitable application, including, e.g., in a memory configuration. In such instances, the magnetoresistive devices may be formed as an integrated circuit comprising a discrete memory device (e.g., as shown in FIG. 11A) or an embedded memory device having a logic therein (e.g., as shown in FIG. 11B), each including MRAM, which, in one embodiment is representative of one or more arrays of MRAM having a plurality of magnetoresistive stacks, according to certain aspects of certain embodiments disclosed herein.

As described previously, a free region 160 including metallized insertion layer 264, first metallized ferromagnetic layer 265, second metallized ferromagnetic layer 266, and/or metallized transition layer 267 may have a decreased damping constant. In some embodiments, metallized insertion layer 264, first metallized ferromagnetic layer 265, second metallized ferromagnetic layer 266, and/or metallized transition layer 267 may be incorporated in a manner to decrease the damping constant, with minimal, or no, negative effects on the RA, MR, and anisotropy field strength of the resulting magnetoresistive stack. Damping constants, anisotropy field strength (Hk), RA, and MR were measured for several magnetoresistive stacks (Examples 1-8), and are shown in Table 1.

TABLE 1

| Example | Normalized Insertion Layer or Metallized Insertion Layer Thickness | RA ($\Omega/\mu m^2$) | MR (%) | Damping Constant | Normalized $H_k$ |
|---|---|---|---|---|---|
| 1 | 1.00 | | | 0.0074 | 1.0870 |
| 2 | 1.00 | 9.8 | 137.9 | 0.0079 | 1.0563 |
| 3 | 1.00 | 10.1 | 122.4 | 0.0076 | 0.9583 |
| 4 | 1.00 | 10.1 | 126.7 | 0.0059 | 0.9895 |
| 5 | 1.00 | 10.1 | 127.7 | 0.0074 | 0.9906 |
| 6 | 1.08 | 10.1 | 120.8 | 0.0073 | 1.0091 |
| 7 | 1.17 | 9.8 | 114.1 | 0.0084 | 0.9629 |
| 8 | 1.00 | 9.6 | 99.6 | 0.0060 | 0.9462 |

Examples 1-5 include an insertion layer 164 comprising pure, or substantially pure (at least 95 at. %) molybdenum. Example 6 includes a metallized insertion layer 264 comprising approximately 92.3 at. % molybdenum and approximately 7.7 at. % chromium. Example 7 includes a metallized insertion layer 264 comprising approximately 85.7 at. % molybdenum and approximately 14.3 at. % chromium. Example 8 includes a metallized insertion layer 264 comprising approximately 67.7 at. % molybdenum and approximately 33.3 at. % chromium.

Examples 1, 2, 5, 6, 7, and 8 include a first ferromagnetic layer 165 comprising cobalt and iron, with no additional metals. Example 3 includes a first metallized ferromagnetic layer 265 comprising cobalt, iron, and approximately 11.1 at. % chromium. Example 4 includes a first metallized ferromagnetic layer 265 comprising cobalt, iron, and approximately 5.9 at. % chromium.

Examples 1, 2, 3, 4, 6, 7, and 8 include a second ferromagnetic layer 166 comprising cobalt, iron, and boron, with no additional metals. Example 5 includes a second metallized ferromagnetic layer 266 comprising cobalt, iron, boron, and approximately 14.3 at. % chromium.

As described previously, a free region 160 including a multilayer structure 360 between an insertion layer 164 and interface layer 161 may have improved magnetic properties. A free region 160 (e.g., as shown in FIGS. 4 and 5) including a multilayer structure 360 comprising a first iron-boron layer 162, a cobalt-iron layer 163, and a second iron-boron layer 162', may result in increased MR and reduced RA. The MR and RA of several magnetoresistive stacks 100 including a free region 160 comprising a multilayer structure 360 comprising a first iron-boron layer 162, a cobalt-iron layer 163, and a second iron-boron layer 162' are plotted in FIG. 12A, as a function of the thickness of the first iron-boron layer 162, where the diamonds represent RA measurements and the circles represent MR measurements. The x-axis represents the thickness, in Angstroms, of the first iron-boron layer 162 of the multilayer structure 360. The left y-axis represents measurements of resistance-area product (RA) in units of ohm-square microns ($\Omega\mu m^2$), and the right y-axis represents measurements of MR in percent (%).

As shown in FIG. 12A, the RA decreases as the thickness of the first iron-boron layer 162 decreases, and the MR reaches a maximum at a thickness of approximately 2-3 Å. The multilayer structure 360 comprising a first iron-boron layer 162, a cobalt-iron layer 163, and a second iron-boron layer 162' results in a free region 160 with iron-boron layer 162 being adjacent to the insertion layer 164. In some situations, this may have a negative effect on the magnetic moment and anisotropy field strength of the free region 160. Magnetic moment and anisotropy field strength measurements of several magnetoresistive stacks 100 including a free region 160 comprising a multilayer structure 360 comprising a first iron-boron layer 162, a cobalt-iron layer 163, and a second iron-boron layer 162' are plotted in FIG. 12B, as a function of the thickness of the second iron-boron layer 162', where the circles represent anisotropy field strength measurements and the diamonds represent magnetic moment measurements. As shown in FIG. 12B, the anisotropy field strength and magnetic moment of the magnetoresistive stack are inversely proportional to the thickness of the second iron-boron layer 162'.

In free regions 160 where the top layer of multilayer structure 360 is a cobalt-iron layer 163 (e.g., second cobalt-iron layer 163' shown in FIGS. 6 and 7), the negative effects to anisotropy field strength caused by the iron-boron layer 162 adjacent to the insertion layer (e.g., metallized insertion layer 264) may be mitigated, and the improved MR may still be observed. FIGS. 13A and 14A show plots of MR measurements, in percent (%), for several magnetoresistive stacks 100 including a free region 160 comprising a multilayer structure 360. FIGS. 13B and 14B show anisotropy field strength measurements for the same magnetoresistive stacks 100. Example 9 includes a single iron-boron layer 162 and a single cobalt-iron layer 163 between interface layer 161 and insertion layer 164. Examples 10-18 include a multilayer structure 360 consisting of a first iron-boron layer 162, a cobalt-iron layer 163, and a second iron-boron layer 162'. Examples 19-27 include a multilayer structure 360 consisting of a first iron-boron layer 162, a first cobalt-iron layer 163, a second iron-boron layer 162', and a second cobalt-iron layer 163'. The thicknesses of the layers of the multilayer structures 360 of Examples 9-27 are shown in Table 2.

TABLE 2

| Example | First FeB Layer Thickness (Å) | First CoFe Layer Thickness (Å) | Second FeB Layer Thickness (Å) | Second CoFe Layer Thickness (Å) |
|---|---|---|---|---|
| 9 | 5 | 6 | | |
| 10 | 4 | 6 | 1 | |
| 11 | 4 | 6 | 1 | |
| 12 | 4 | 6 | 1 | |
| 13 | 3 | 6 | 2 | |
| 14 | 3 | 6 | 2 | |
| 15 | 3 | 6 | 2 | |
| 16 | 2 | 6 | 3 | |
| 17 | 2 | 6 | 3 | |
| 18 | 2 | 6 | 3 | |
| 19 | 4 | 5 | 1 | 1 |
| 20 | 4 | 4 | 1 | 2 |
| 21 | 4 | 3 | 1 | 3 |
| 22 | 3 | 5 | 2 | 1 |
| 23 | 3 | 4 | 2 | 2 |

TABLE 2-continued

| Example | First FeB Layer Thickness (Å) | First CoFe Layer Thickness (Å) | Second FeB Layer Thickness (Å) | Second CoFe Layer Thickness (Å) |
|---|---|---|---|---|
| 24 | 3 | 3 | 2 | 3 |
| 25 | 2 | 5 | 3 | 1 |
| 26 | 2 | 4 | 3 | 2 |
| 27 | 2 | 3 | 3 | 3 |

In one embodiment, a magnetoresistive stack is disclosed. The magnetoresistive stack includes a fixed region having a fixed magnetic state, a spacer region, a first dielectric layer, a second dielectric layer, and a free region configured to have a first magnetic state and a second magnetic state. Both the first dielectric layer and the second dielectric layer are positioned between the fixed region and the spacer region, and the free region is positioned between the first dielectric layer and the second dielectric layer. The free region includes an insertion layer, a first ferromagnetic layer above the insertion layer, and a second ferromagnetic layer above the first ferromagnetic layer. The insertion layer comprises molybdenum, tungsten, tantalum, or a combination thereof. The insertion layer further comprises less than or equal to approximately 35 atomic percent of additional metal, where additional metal includes one or more metals from a group consisting of: titanium, chromium, vanadium, manganese, niobium, gold, copper, silver, rhodium, palladium, cobalt, nickel, and iron. The first ferromagnetic layer comprises cobalt, iron, boron, or a combination thereof. The second ferromagnetic layer comprises cobalt, iron, boron, or a combination thereof.

Various embodiments of the disclosed magnetoresistive stack may additionally or alternatively include one or more of the following features: the free region may further comprise a transition layer comprising iron, above the second ferromagnetic layer; the free region may be in contact with the first dielectric layer and the second dielectric layer; the free region may further comprise an interface layer comprising greater than or equal to approximately 50 atomic percent, and a first layer comprising iron and boron, above the interface layer; the free region may further comprise a second layer comprising cobalt and iron, between the first layer and the insertion layer; and/or one or more of: the first ferromagnetic layer, the second ferromagnetic layer, or the transition layer comprise approximately 1 atomic percent to approximately 15 atomic percent of auxiliary additional metal, where the auxiliary additional metal includes one or more metals from a group consisting of: chromium, vanadium, manganese, niobium, tantalum, tungsten, gold, copper, silver, rhodium, and palladium; the transition layer may include more auxiliary additional metal, by atomic percent, than the first ferromagnetic layer.

In another embodiment, a magnetoresistive stack is disclosed. The magnetoresistive stack includes a fixed region having a fixed magnetic state, a spacer region, a first dielectric layer, a second dielectric layer, and a free region configured to have a first magnetic state and a second magnetic state. Both the first dielectric layer and the second dielectric layer are positioned between the fixed region and the spacer region, and the free region is positioned between the first dielectric layer and the second dielectric layer. The free region includes an insertion layer comprising molybdenum, tungsten, tantalum, or a combination thereof, an interface layer in contact with the first dielectric layer, the interface layer comprising at least 50 atomic percent iron, and a multilayer structure between the insertion layer and the interface layer. The multilayer structure includes at least three layers, wherein each layer of the multilayer structure comprises: (i) iron and boron, or (ii) cobalt and iron.

Various embodiments of the disclosed magnetoresistive stack may additionally or alternatively include one or more of the following features: the multilayer structure may be in contact with the interface layer and/or the insertion layer; the layer of the multilayer structure that is in contact with the interface layer may comprise iron and boron; the layer of the multilayer structure that is in contact with the insertion layer may comprise cobalt and iron; the multilayer structure may comprise a first layer comprising iron and boron, a second layer above the first layer, the second layer comprising cobalt and iron, and a third layer between the second layer and the insertion layer, the third layer comprising iron and boron; and/or the multilayer structure may further comprise a fourth layer between the third layer and the insertion layer, the fourth layer comprising cobalt and iron.

In another embodiment, a magnetoresistive stack is disclosed. The magnetoresistive stack includes a fixed region having a fixed magnetic state, a spacer region, a first dielectric layer, a second dielectric layer, and a free region configured to have a first magnetic state and a second magnetic state. The free region comprises an interface layer in contact with the first dielectric layer, an insertion layer, a first ferromagnetic layer above the insertion layer, a second ferromagnetic layer above the first ferromagnetic layer, a transition layer between the second ferromagnetic layer and the second dielectric layer, the transition layer comprising iron, and a multilayer structure between the insertion layer and the interface layer. The interface layer comprises at least approximately 50 atomic percent iron. The insertion layer comprises molybdenum, tungsten, tantalum, or a combination thereof, and less than or equal to approximately 35 atomic percent of additional metal, where additional metal includes one or more metals from a group consisting of: titanium, chromium, vanadium, manganese, niobium, gold, copper, silver rhodium, palladium, cobalt, nickel, and iron. The first ferromagnetic layer comprises cobalt, iron, boron, or a combination thereof. The second ferromagnetic layer comprises cobalt, iron, boron, or a combination thereof. The transition layer comprises iron. The multilayer structure includes at least three layer, wherein each layer of the multilayer structure comprises: (i) iron and boron; or (ii) cobalt and iron.

Various embodiments of the disclosed magnetoresistive stack may additionally or alternatively include one or more of the following features: a first electrically conductive material; a second electrically conductive material; a seed region between the first electrically conductive material and the fixed region; the fixed region, the first dielectric layer, the free region, the second dielectric layer, and the spacer region may be positioned between the first electrically conductive material and the second electrically conductive material; one or more of the first ferromagnetic layer, the second ferromagnetic layer, or the transition layer may comprise approximately 1 percent to approximately 15 percent of auxiliary additional metal, where auxiliary additional metal includes one or more metals from a group consisting of: chromium, vanadium manganese, niobium, tantalum, tungsten, gold, copper, silver, rhodium, and palladium; the multilayer structure may be in contact with the insertion layer, and the layer of the multilayer structure that is in contact with the insertion layer comprises cobalt and iron; and/or the fixed region may be a first fixed region and the spacer region may include a second fixed region.

Although various embodiments of the present disclosure have been illustrated and described in detail, it will be readily apparent to those skilled in the art that various modifications may be made without departing from the present disclosure.

What is claimed is:

1. A magnetoresistive stack comprising:
a fixed region having a fixed magnetic state;
a spacer region;
a first dielectric layer and a second dielectric layer, where both the first dielectric layer and the second dielectric layer are between the fixed region and the spacer region; and
a free region between the first dielectric layer and the second dielectric layer, the free region configured to have a first magnetic state and a second magnetic state, and comprising:
an insertion layer comprising molybdenum, tungsten, tantalum, or a combination thereof, and an additional metal that includes one or more metals from a group consisting of: titanium, chromium, vanadium, manganese, niobium, gold, copper, silver, rhodium, palladium, cobalt, nickel, and iron;
a first ferromagnetic layer above the insertion layer, the first ferromagnetic layer comprising cobalt, iron, boron, or a combination thereof;
a second ferromagnetic layer above the first ferromagnetic layer, the second ferromagnetic layer comprising cobalt, iron, boron, or a combination thereof; and
a transition layer above the second ferromagnetic layer, wherein the first ferromagnetic layer, the second ferromagnetic layer, and the transition layer each comprise approximately 1 atomic percent to approximately 15 atomic percent of an auxiliary additional metal, wherein the auxiliary additional metal includes one or more metals from a group consisting of: chromium, vanadium, manganese, niobium, tantalum, tungsten, gold, copper, silver, rhodium, and palladium, and wherein the transition layer includes more of the auxiliary additional metal, by atomic percent, than the first ferromagnetic layer.

2. The magnetoresistive stack of claim 1, wherein the free region is in contact with the first dielectric layer and the second dielectric layer.

3. The magnetoresistive stack of claim 1, wherein the free region further comprises:
an interface layer comprising greater than or equal to approximately 50 atomic percent iron; and
a first layer above the interface layer, where the first layer comprises iron and boron.

4. The magnetoresistive stack of claim 3, wherein the free region further comprises a second layer between the first layer and the insertion layer, where the second layer comprises cobalt and iron.

5. A magnetoresistive stack comprising:
a fixed region having a fixed magnetic state;
a spacer region;
a first dielectric layer and a second dielectric layer, where both the first dielectric layer and the second dielectric layer are between the fixed region and the spacer region; and
a free region between the first dielectric layer and the second dielectric layer, the free region configured to have a first magnetic state and a second magnetic state, and comprising:
an insertion layer comprising molybdenum, tungsten, tantalum, or a combination thereof, and an additional metal that includes one or more metals from a group consisting of: titanium, chromium, vanadium, manganese, niobium, gold, copper, silver, rhodium, palladium, cobalt, nickel, and iron;
an interface layer in contact with the first dielectric layer, the interface layer comprising at least 50 atomic percent iron;
a multilayer structure between the insertion layer and the interface layer, the multilayer structure including at least three layers, the at least three layers including:
a first layer comprising iron and boron;
a second layer above and in contact with the first layer, the second layer comprising cobalt and iron; and
a third layer above and in contact with the second layer, the third layer comprising iron and boron;
a first ferromagnetic layer above the insertion layer, the first ferromagnetic layer comprising cobalt, iron, boron, or a combination thereof;
a second ferromagnetic layer above the first ferromagnetic layer, the second ferromagnetic layer comprising cobalt, iron, boron, or a combination thereof; and
a transition layer above the second ferromagnetic layer, wherein the first ferromagnetic layer, the second ferromagnetic layer, and the transition layer each comprise approximately 1 atomic percent to approximately 15 atomic percent of an auxiliary additional metal, the auxiliary additional metal including one or more metals from a group consisting of: chromium, vanadium, manganese, niobium, tantalum, tungsten, gold, copper, silver, rhodium, and palladium.

6. The magnetoresistive stack of claim 5, wherein the multilayer structure is in contact with the interface layer and the insertion layer.

7. The magnetoresistive structure of claim 6, wherein the layer of the multilayer structure that is in contact with the interface layer comprises iron and boron.

8. The magnetoresistive structure of claim 6, wherein the layer of the multilayer structure that is in contact with the insertion layer comprises cobalt and iron.

9. The magnetoresistive stack of claim 5, wherein the multilayer structure further comprises a fourth layer between the third layer and the insertion layer, the fourth layer comprising cobalt and iron.

10. The magnetoresistive stack of claim 5, wherein the multilayer structure is in contact with the insertion layer, and the layer of the multilayer structure that is in contact with the insertion layer comprises cobalt and iron.

11. The magnetoresistive stack of claim 5, wherein the fixed region is a first fixed region, and the spacer region includes a second fixed region.

12. A magnetoresistive stack comprising:
a fixed region having a fixed magnetic state;
a spacer region;
a first dielectric layer and a second dielectric layer, where both the first dielectric layer and the second dielectric layer are between the fixed region and the spacer region; and
a free region in contact with both the first dielectric layer and the second dielectric layer, where the free region is configured to have a first magnetic state and a second magnetic state, and comprises:
an interface layer in contact with the first dielectric layer, the interface layer comprising at least approximately 50 atomic percent iron;

an insertion layer comprising molybdenum, tungsten, tantalum, or a combination thereof, and less than or equal to approximately 35 atomic percent of an additional metal, but greater than zero, where the additional metal includes one or more metals from a group consisting of: titanium, chromium, vanadium, manganese, niobium, gold, copper, silver, rhodium, palladium, cobalt, nickel, and iron;

a first ferromagnetic layer above the insertion layer, the first ferromagnetic layer comprising cobalt, iron, boron, or a combination thereof;

a second ferromagnetic layer above the first ferromagnetic layer, the second ferromagnetic layer comprising cobalt, iron, boron, or a combination thereof; and a transition layer between the second ferromagnetic layer and the second dielectric layer, the transition layer comprising iron; and a multilayer structure between the insertion layer and the interface layer, the multilayer structure including at least three layers, wherein each layer of the multilayer structure comprises:
  (i) iron and boron; or
  (ii) cobalt and iron, wherein each of the first ferromagnetic layer, the second ferromagnetic layer, and the transition layer comprises approximately 1 atomic percent to approximately 15 atomic percent of an auxiliary additional metal, wherein the auxiliary additional metal includes one or more metals from a group consisting of: chromium vanadium, manganese, niobium, tantalum, tungsten, gold, copper, silver, rhodium, and palladium, and wherein the transition layer includes more of the auxiliary additional metal, by atomic percent, than the first ferromagnetic layer.

13. The magnetoresistive stack of claim 12, wherein the multilayer structure is in contact with the insertion layer, and the layer of the multilayer structure that is in contact with the insertion layer comprises cobalt and iron.

14. The magnetoresistive stack of claim 12, wherein the fixed region is a first fixed region, and the spacer region includes a second fixed region.

15. The magnetoresistive stack of claim 12, further comprising a first electrically conductive material, and a second electrically conductive material, and wherein the fixed region, the first dielectric layer, the free region, the second dielectric layer, and the spacer region are between the first electrically conductive material and the second electrically conductive material.

16. The magnetoresistive stack of claim 15, further comprising a seed region between the first electrically conductive material and the fixed region.

* * * * *